US012624442B2

(12) United States Patent
Vervuurt et al.

(10) Patent No.: US 12,624,442 B2
(45) Date of Patent: May 12, 2026

(54) METHODS FOR PROVIDING A PRECURSOR MIXTURE TO A REACTION CHAMBER

(71) Applicant: ASM IP Holding, B.V., Almere (NL)

(72) Inventors: René Henricus Jozef Vervuurt, Leuven (BE); Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 13 days.

(21) Appl. No.: 18/462,938

(22) Filed: Sep. 7, 2023

(65) Prior Publication Data

US 2024/0102156 A1 Mar. 28, 2024

Related U.S. Application Data

(60) Provisional application No. 63/374,936, filed on Sep. 8, 2022.

(51) Int. Cl.

*C23C 16/04* (2006.01)
*C23C 16/32* (2006.01)
*C23C 16/34* (2006.01)

(52) U.S. Cl.

CPC .......... *C23C 16/045* (2013.01); *C23C 16/325* (2013.01); *C23C 16/342* (2013.01)

(58) Field of Classification Search

CPC .... C23C 16/045; C23C 16/325; C23C 16/342
See application file for complete search history.

(56) References Cited

U.S. PATENT DOCUMENTS 8,993,058 B2 * 3/2015 Anthis ................ H01L 21/0215 427/255.393
9,549,383 B2 * 1/2017 Ma ........................ H04W 56/00
10,301,719 B1 * 5/2019 Paquette ........... H01L 23/53295
10,557,203 B2 * 2/2020 Carlson .................... F25B 21/02
2005/0070126 A1 * 3/2005 Senzaki ............ C23C 16/45529 438/785
2007/0248516 A1 * 10/2007 Bailey .................... B01D 53/38 422/600
2007/0281448 A1 * 12/2007 Chen ................... H01L 21/3105 156/345.31

(Continued)

OTHER PUBLICATIONS

Wu, Yanlin, et al., "Atomic Layer Deposition from Dissolved Precursors". Nano Letters 2015, 15, 6379-6385.*

(Continued)

*Primary Examiner* — Bret P Chen
(74) *Attorney, Agent, or Firm* — Banner & Witcoff, Ltd.

(57) ABSTRACT

Aspects described herein provide a method of providing a precursor mixture of a first precursor and a second precursor to a reaction chamber. The method may comprise maintaining the first precursor in the first precursor vessel at a first precursor temperature and the second precursor in the second precursor vessel at a second precursor temperature. Fluid connections may be provided between the first precursor vessel and the mixing chamber, between the second precursor vessel and the mixing chamber, and between the mixing chamber and the reaction chamber. The reaction chamber is separate from the mixing chamber. The precursor mixture is formed in the mixing chamber by mixing the first precursor and the second precursor and then provided to the reaction chamber.

19 Claims, 8 Drawing Sheets

(56) References Cited

U.S. PATENT DOCUMENTS

| | | | | |
|---|---|---|---|---|
| 2012/0298040 | A1* | 11/2012 | Woelk | C23C 16/45557 427/248.1 |
| 2013/0302520 | A1* | 11/2013 | Wang | C23C 16/45512 118/724 |
| 2014/0020764 | A1* | 1/2014 | Woelk | C23C 16/4481 137/1 |
| 2014/0065842 | A1* | 3/2014 | Anthis | C23C 16/45529 438/786 |
| 2017/0178956 | A1* | 6/2017 | Park | C23C 16/16 |
| 2018/0223429 | A1* | 8/2018 | Fukazawa | C23C 16/45565 |
| 2019/0085481 | A1* | 3/2019 | Asbeck | C30B 35/007 |
| 2019/0249300 | A1* | 8/2019 | Hatanpää | H01L 21/76879 |
| 2020/0071830 | A1* | 3/2020 | Lee | D06M 23/105 |
| 2020/0209201 | A1* | 7/2020 | Abolhasani | G01N 21/05 |
| 2021/0332261 | A1* | 10/2021 | Askin, III | B05D 1/08 |
| 2023/0212744 | A1 | 7/2023 | Vervuurt et al. | |

OTHER PUBLICATIONS

Bae, Jong Wook, et al., “Hydrodechlorination of CCI4 over Pt/g-Al2O3 prepared from different Pt precursors”. Applied Catalysis A: General 334 (2008) 156-167.*

Ding, Dong-Sheng, et al., “Optical Precursor with Four-Wave Mixing and Storage Based on a Cold-Atom Ensemble”. Physical Review Letters, 114, 093601 (2015), pp. 1-4.*

Vahlas, Constantin, et al., “Liquid and Solid Precursor Delivery Systems in Gas Phase Processes”. Recent Patents on Materials Science, 2015, 8 (2), pp. 91-108.*

Potts, S.E., et al., “Energy-enhanced atomic layer deposition for more process and precursor versatility”. Coordination Chemistry Reviews 257 (2013) 3254-3270.*

* cited by examiner

| Monomer Content | SiC | C | SiCO | SiCN | SiN | Si | BN | CON |
|---|---|---|---|---|---|---|---|---|
| SiC | | | | | | | | |
| C | | | | | | | | |
| SiCO | | | | | | | | |
| SiCN | | | | | | | | |
| SiN | | | | | | | | |
| Si | | | | | | | | |
| BN | | | | | | | | |
| CON | | | | | | | | |

Enhanced Composition Control

Some Composition Control

METHODS FOR PROVIDING A PRECURSOR MIXTURE TO A REACTION CHAMBER

CROSS-REFERENCE TO RELATED APPLICATION(S)

This application claims the benefit of U.S. Provisional Application 63/374,936 filed on Sep. 8, 2022, the entire contents of which are incorporated herein by reference.

FIELD OF INVENTION

The present disclosure generally relates to methods and systems suitable for providing a precursor mixture to a reaction chamber. The resulting precursor mixture can be used, for example, for forming a flowable material in gaps, trenches, and the like by plasma-assisted deposition processes and the like.

BACKGROUND OF THE DISCLOSURE

Flowable materials, or gap filling fluids, are commonly used for filling small gaps or recesses in semiconductor device processing. However, only a limited amount of materials can be formed using gap filling fluid-based processes of the prior art. Furthermore, it can be difficult to control the composition of the materials that are formed. In particular, the elemental composition of the gap filling fluid is often very similar to the elemental composition of the precursor which is used in the corresponding process.

A mixture of precursors can be used for compositional tuning, and opens up compositions that are approximately in between the compositions of the constituent precursors in the mixture. Such methods are described in US publication no. 2023/0212744 A1. When multiple precursors are used, it is desirable to provide those precursors uniformly to a substrate. Therefore, there is a need for methods and devices for uniformly providing multiple precursors to a substrate.

Additionally, there is a need for methods and devices for homogeneously mixing a precursor mixture before it is provided to a reaction chamber.

Any discussion, including discussion of problems and solutions, set forth in this section has been included in this disclosure solely for the purpose of providing a context for the present disclosure. Such discussion should not be taken as an admission that any or all of the invention was previously known or otherwise constitutes prior art.

SUMMARY OF THE DISCLOSURE

Various embodiments of the present disclosure relate to methods for mixing precursors, to structures and devices formed using such methods, and to apparatus for performing the methods and/or for forming the structure and/or devices. The ways in which various embodiments of the present disclosure address drawbacks of prior methods and systems are discussed in more detail below.

In particular, described herein is a method of mixing a first precursor and a second precursor. The method comprises providing a precursor module that comprises a first precursor vessel comprising a first precursor, a second precursor vessel comprising a second precursor, and a mixing chamber. The method further comprises maintaining the first precursor in the first precursor vessel at a first precursor temperature. The method further comprises maintaining the second precursor in the second precursor vessel at a second precursor temperature. The method further comprises providing a first fluid connection between the first precursor vessel and the mixing chamber. The method further comprises providing a second fluid connection between the second precursor vessel and the mixing chamber. The method further comprises providing the first precursor and the second precursor to the mixing chamber. The method further comprises controlling, by a controller, the first precursor temperature and the second precursor temperature. Thus, a first predetermined amount of first precursor is provided to the mixing chamber and a second predetermined amount of second precursor is provided to the mixing chamber.

In some embodiments, the first precursor has a first vapor pressure, the second precursor has a second vapor pressure, the second vapor pressure is higher than the first vapor pressure, and providing the first precursor and the second precursor to the mixing chamber comprises first providing the first precursor to the mixing chamber and subsequently providing the second precursor to the mixing chamber.

In some embodiments, a first mass controller is provided between the first precursor source and the mixing chamber. The first mass controller is constructed and arranged to regulate the amount of first precursor that is provided to the mixing chamber.

In some embodiments, a second mass controller is provided between the second precursor source and the mixing chamber. The second mass controller is constructed and arranged to regulate the amount of second precursor that is provided to the mixing chamber.

Further described herein is a method of mixing a first precursor and a second precursor. The method comprises providing a precursor module comprising a first precursor vessel comprising a first precursor, a second precursor vessel comprising a second precursor, and a mixing chamber. The method further comprises providing a first fluid connection between the first precursor vessel and the mixing chamber. The first fluid connection is provided with a first liquid flow regulator. The method further comprises providing a second fluid connection between the second precursor vessel and the mixing chamber. The second fluid connection is provided with a second liquid flow regulator. The method further comprises providing the first precursor in liquid form to the mixing chamber. The method further comprises providing the second precursor in liquid form to the mixing chamber. The method further comprises controlling, by a controller, the first liquid flow regulator to provide a pre-determined first flow rate of first precursor to the mixing chamber. The method further comprises controlling, by the controller, the second liquid flow regulator to provide a pre-determined second flow rate of second precursor to the mixing chamber.

In some embodiments, the method further comprises a step of providing a carrier gas to the mixing chamber.

Further described herein is a method of providing a precursor mixture to a reaction chamber. The method comprises mixing the first precursor and the second precursor in accordance with a method as described herein. Thus, a precursor mixture is formed. The thusly formed precursor mixture is provided to the reaction chamber.

In some embodiments, the precursor mixture is continuously provided to the reaction chamber.

Further described herein is a method of providing a precursor mixture to a reaction chamber. The method comprises executing one or more mixing cycles. A mixing cycle comprises mixing a first precursor and a second precursor in accordance with a method as described herein, thereby forming a precursor mixture; and, opening a mixing valve, the mixing valve being provided downstream of the mixing chamber and upstream of the reaction chamber; thereby providing the precursor mixture from the mixing chamber to the reaction chamber.

In some embodiments, the mixing valve is provided on an exhaust port of the mixing chamber.

In some embodiments, the mixing valve is provided on a precursor mixture line, the precursor mixture line being constructed and arranged to provide the precursor mixture to the reaction chamber when the mixing valve is in an open position.

Further described herein is a method of filling a gap. The method comprises introducing a substrate in a reaction chamber. The substrate is provided with a gap. The method further comprises introducing a precursor mixture to the reaction chamber by means of a method as described herein. The method further comprises generating a plasma in the reaction chamber thereby forming a gap filling fluid that at least partially fills the gap. The precursor mixture comprises a first precursor and a second precursor, the first precursor and the second precursor are different and each have a molar mass of at least 50 g/mol.

Further described herein is a method of filling a gap. The method comprises introducing a substrate in a reaction chamber. The substrate is provided with a gap. The method further comprises introducing a precursor mixture to the reaction chamber by means of a method as described herein. The method further comprises generating a plasma in the reaction chamber. Thus, a gap filling fluid is formed that at least partially fills the gap. The precursor mixture comprises a first precursor and a second precursor, the first precursor and the second precursor are different and each comprise at least one of an alkali metal, an alkaline earth metal, a halogen, boron (B), aluminum (Al), carbon (C), and silicon (Si).

In some embodiments, the first precursor comprises a first element, the second precursor comprises a second element, the first element and the second element are different, and the first element and the second element are incorporated in the gap filling fluid.

In some embodiments, at least one of the first precursor and the second precursor is selected from the list consisting of hydrocarbons, amines, amides, imides, silanes, alkylsilanes, siloxanes, and borazanes.

In some embodiments, at least one of the first precursor and the second precursor comprises C; Si; Si and C; Si, C, and O; Si, C, and N; Si and N; Si; B and N; or C, O, and N.

In some embodiments, at least one of the first precursor and the second precursor comprises a metal precursor. The metal precursor comprises a metal.

In some embodiments, the metal is selected from an alkali metal, an earth alkali metal, a transition metal, a lanthanide, and a post transition metal.

In some embodiments, the metal precursor is selected from the list consisting of: metal halides, metal alkyls, metal alkenyls, metal aryls, metal beta-diketonates, metal alkoxides, and metal aryloxides.

Further described herein is a system that comprises a precursor module that in turn comprises a first precursor vessel comprising a first precursor, a second precursor vessel comprising a second precursor, and a mixing chamber. The system further comprises a first fluid connection between the first precursor vessel and the mixing chamber; a second fluid connection between the second precursor vessel and the mixing chamber; a reaction chamber; a precursor mixture line; and a controller. The first precursor is different from the second precursor. The first precursor vessel comprises a first precursor heating element constructed and arranged for maintaining the first precursor in the first precursor vessel at a first precursor temperature. The second precursor vessel comprises a second precursor heating element constructed and arranged for maintaining the second precursor in the first precursor vessel at a second precursor temperature, the first precursor temperature and the second precursor temperature being different. The controller is constructed and arranged for maintaining the first precursor vessel at a first precursor temperature by means of the first precursor heating element. The controller is further constructed and arranged for maintaining the second precursor vessel at a second precursor temperature by means of the second precursor heating element. The precursor mixture line is constructed and arranged for providing a precursor mixture from the mixing chamber to the reaction chamber.

Further described is a system that comprises a precursor module. The precursor module comprises a first precursor vessel comprising a first precursor, a second precursor vessel comprising a second precursor, and a mixing chamber. The system further comprises a first fluid connection between the first precursor vessel and the mixing chamber, the first fluid connection being provided with a first liquid flow regulator constructed and arranged for providing the first precursor in liquid form to the mixing chamber. The system further comprises a second fluid connection between the second precursor vessel and the mixing chamber, the second fluid connection being provided with a second liquid flow regulator constructed and arranged for providing the second precursor in liquid form to the mixing chamber. The system further comprises a reaction chamber; a precursor mixture line between the mixing chamber and the reaction chamber; and a controller. The first precursor is different from the second precursor. The controller is constructed and arranged for causing the first liquid flow regulator to provide a pre-determined first flow rate of first precursor to the mixing chamber. The controller is further constructed and arranged for causing the second liquid flow regulator to provide a pre-determined second flow rate of second precursor to the mixing chamber. The precursor mixture line is constructed and arranged for providing a precursor mixture from the mixing chamber to the reaction chamber.

In some embodiments, the controller is further constructed and arranged for causing the system to carry out a method as described herein.

In some embodiments, the system further comprises a carrier gas source in fluid connection with the mixing chamber. The carrier gas source is provided with a carrier gas mass flow controller In some embodiments, the mixing chamber comprises a mixing chamber wall that comprises a spiral pattern.

In some embodiments, the mixing chamber comprises a piezoelectric control valve, the controller is constructed and arranged for actuating the piezoelectric control valve to regulate at least one of carrier gas flow, first precursor flow, and second precursor flow into the mixing chamber.

In some embodiments, the reaction chamber comprises a showerhead injector which is positioned parallel to a substrate support. The showerhead injector is further operationally connected to the precursor mixture line. The showerhead injector is constructed and arranged for providing the precursor mixture to the reaction chamber.

In some embodiments, the system further comprises an RF power source. The RF power source is electrically connected to one of the showerhead injector and the substrate support. The RF power source is constructed and arranged for generating a plasma between the showerhead injector and the substrate support.

In some embodiments, the system further comprises a plasma generating unit that is positioned outside of the reaction chamber.

In some embodiments, the plasma generating unit is positioned adjacent to the reaction chamber.

In some embodiments, the plasma generating unit is positioned remotely from the reaction chamber.

In some embodiments, the mixing chamber further comprises two or more mixing compartments including a first mixing compartment and a second mixing compartment. The first mixing compartment is in connection with the first precursor source via the first fluid connection. The second mixing compartment is in fluid connection with the second mixing compartment via the second fluid connection. A compartment valve is provided between the first mixing compartment and the second mixing compartment.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
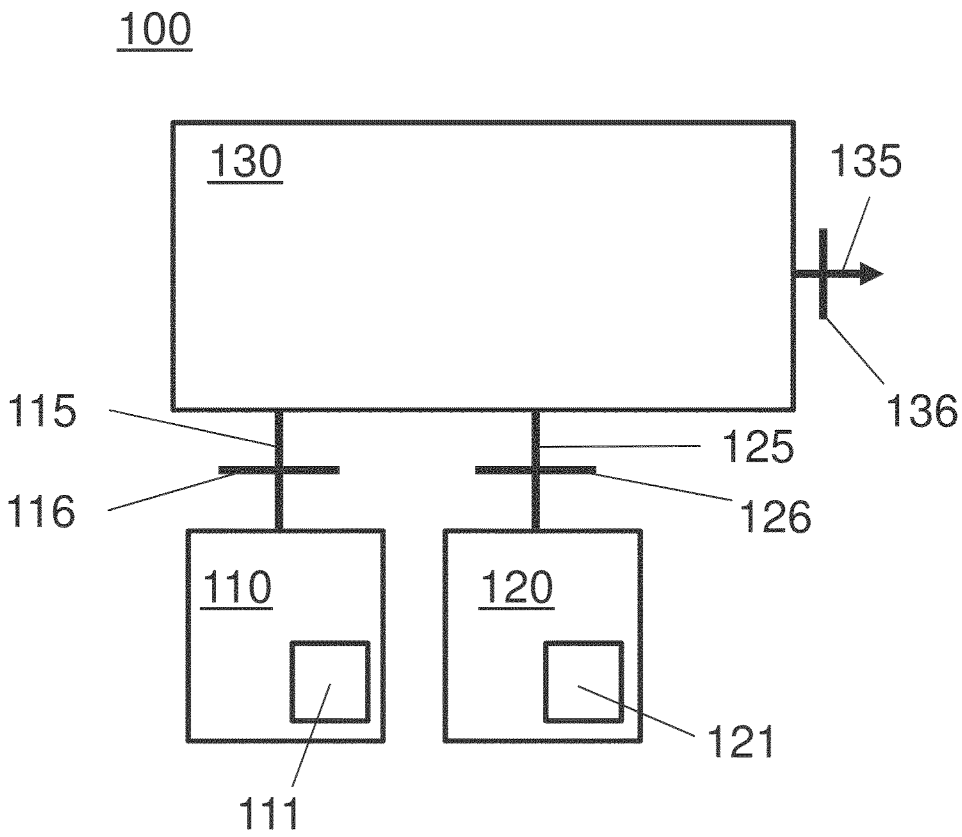
FIG. 1 shows an embodiment of a precursor module (100) as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

In some embodiments, the term "reactant" refers to a gas which can react and/or interact with one or more precursors in order to form a gap filling fluid as described herein. The reactant may activate precursor oligomerization in a reaction chamber. The reactant may comprise a catalyst. The reactant does not necessarily have to be incorporated in the material, e.g. gap filling fluid, which is formed, though the reactant does interact with the precursor during formation of that material. In other words, in some embodiments the reactant is incorporated in the material whereas in other embodiments, the reactant is not, or not substantially, incorporated in the material. Possible reactants include noble gasses, which can be brought in an excited state, in particular an excited state such as ion and/or radical induced by means of a plasma, such as He and Ar, as well as other gasses such as $H_2$. Alternative expressions for the term "reactant" as used herein may include "reactant", "gas mixture", "one or more further gasses", and "gas mixture comprising one or more further gasses".

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

It shall be understood that terms like "depositing" and the like as used herein can refer to a phase change from the gas phase to a solid phase change, through an intermediate flowable phase. Indeed, the meaning of the term "depositing" can include phase changes from a gaseous phase to a liquid phase, and can include processes in which gaseous reactants form liquid, liquid-like, or solidifying fluids. Thus, the meaning of the term "depositing" can encompass similar terms like condensing or forming.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim unworkable. In some embodiments, the term "comprising" includes "consisting".

As used herein, the term "consisting" indicates that no further features are present in the apparatus/method/product apart from the ones following said wording. When the term "consisting" is used referring to a chemical compound, substance, or composition of matter, it indicates that the chemical compound, substance, or composition of matter only contains the components which are listed. This notwithstanding, the chemical compound, substance, or composition of matter may, in some embodiments, comprise other components as trace elements or impurities, apart from the components that are listed.

In some embodiments, the term "gap filling fluid", also referred to as "flowable gap fill", may refer to an oligomer which is liquid under the conditions under which is deposited on a substrate and which has the capability to cross link and for a solid film. Gap filling fluids can be temporarily flowable, i.e. they can be a transitory liquid phase comprising oligomers undergoing a polymerizing chain reaction. The polymerizing chain reaction can result in formation of a solid end product.

In some embodiments, the term "filling capability" may refer to a capability of filling a gap substantially without voids (e.g., no void having a size of approximately 5 nm or greater in diameter) and seams (e.g. no seam having a length of approximately 5 nm or greater), wherein seamless/void less bottom-up growth of a layer is observed. In some embodiments, the growth at a bottom of a gap may be at least approximately 1.5 times faster than growth on sidewalls of the gap and on a top surface having the gap. A film having filling capability can be referred to as "flowable film" or "viscous film". The flowable or viscous behavior of a film is often manifested as a concave surface at a bottom of a trench.

In this disclosure, a recess between adjacent protruding structures and any other recess pattern may be referred to as a "trench". That is, a trench may refer to any recess pattern including a hole/via. A trench can have, in some embodiments, a width of about 5 nm to about 150 nm, or about 30 nm to about 50 nm, or about 5 nm to about 10 nm, or about 10 nm to about 20 nm, or about 20 nm to about 30 nm, or about 50 nm to about 100 nm, or about 100 nm to about 150 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a trench has an aspect ratio of about 2 to about 10, and typically of about 2 to about 5. The dimensions of the trench may vary depending on process conditions, film composition, intended application, etc.

The following abbreviations are used herein: $^{t}$Bu stands for tert-butyl, $^{i}$Pr stands for isopropyl, Me stands for methyl, Et stands for ethyl, thd stands for 2,2,6,6-tetramethyl-3,5-heptanedionate, mmp stands for 1-methoxy-2-methyl-2-propoxide, hfac stands for hexafluoroacetylacetonate, Np stands for neopentyl, acac stands for acetylacetonate, AMD stands for acetamidinate, $^{t}Bu_2$DAD stands for 1,4-di-tert-butyl-1,3-diazadiene, py stands for 2,4-pentanedionate.

When specific process conditions are provided in this disclosure, they are provided for a reaction chamber volume of 1 liter and for 300 mm wafers. A skilled artisan understands that these values can be readily extended to other reaction chamber volumes and wafer sizes.

Methods and systems as described herein allow mixing two different precursors before they are provided to a reaction chamber. The presently described methods and systems allow providing a precursor mixture to a reaction chamber having a predetermined composition which can be accurately controlled regardless of the fill level of precursor vessels containing the precursors which are contained in the precursor mixture.

Described herein is a method of mixing a first precursor and a second precursor. The method comprises providing a precursor module comprising a first precursor vessel, a second precursor vessel, and a mixing chamber. The first precursor vessel can comprise first precursor in a liquid or a solid state. The second precursor vessel can comprise second precursor in a liquid or a solid state. The precursor module can, for example, be comprised in a system as described herein. It shall be understood that the first precursor and the second precursor are different.

The method comprises maintaining the first precursor, which is comprised in the first precursor vessel, at a first precursor temperature.

The method further comprises maintaining the second precursor in the second precursor vessel at a second precursor temperature. In some embodiments, the first precursor temperature and the second precursor temperature are different. In some embodiments, the first precursor temperature equals the second precursor temperature.

The method further comprises providing a first fluid connection between the first precursor vessel and the mixing chamber.

The method further comprises providing a second fluid connection between the second precursor vessel and the mixing chamber.

The method further comprises providing the first precursor and the second precursor to the mixing chamber.

The method further comprises causing the controller to control the first precursor temperature and the second precursor temperature. Thus, a first predetermined amount of first precursor is provided to the mixing chamber, and a second predetermined amount of second precursor is provided to the mixing chamber. Indeed, the vapor pressure and evaporation rate of the first precursor and the second precursor can be suitably and respectively controlled by controlling the first precursor temperature and the second precursor temperature. So controlling these process parameters can allow controlling the amount of first precursor and the amount of second precursor that is provided to the process chamber.

In some embodiments, a carrier gas source can be provided which can be in fluid connection with at least one of the first precursor vessel and the second precursor vessel. Accordingly, at least one of the first precursor and the second precursor can be provided to the mixing chamber using a carrier gas. Suitable carrier gasses include H2, N2, and noble gasses such as He, Ne, Ar, Kr, and Xe.

When the first precursor and the second precursor have different vapor pressures, first providing the precursor having the lowest vapor pressure to the mixing chamber can be useful to avoid unwanted flow of the high vapor pressure precursor into the precursor vessel that contains the low vapor pressure precursor.

Thus, in some embodiments, the first precursor has a first vapor pressure, and the second precursor has a second precursor, and the second vapor pressure is higher than the first vapor pressure. In such embodiments, providing the first precursor and the second precursor to the mixing chamber can comprise first providing the first precursor to the mixing chamber and subsequently providing the second precursor to the mixing chamber.

An alternative way of handling precursors that have a different vapor pressure can employ mass controllers. Thus, in some embodiments, a first mass controller is provided between the first precursor source and the mixing chamber. The first mass controller is constructed and arranged to regulate the amount of first precursor that is provided to the mixing chamber. Additionally or alternatively, a second mass controller can be provided between the second precursor source and the mixing chamber. The second mass controller is constructed and arranged to regulate the amount of second precursor that is provided to the mixing chamber.

As described elsewhere herein, at least one of a first precursor and a second precursor can be provided to a mixing chamber in the gaseous state. Alternatively, at least one of a first precursor and a second precursor can be provided to a mixing chamber as liquids. Thus, further described herein is a method of mixing a first precursor and a second precursor. The method comprises providing a precursor module. The precursor module comprises a first precursor vessel, a second precursor vessel, and a mixing chamber. The first precursor vessel comprises a first precursor. The second precursor vessel comprises a second precursor. A first fluid connection is provided between the first precursor vessel and the mixing chamber. The first fluid connection is provided with a first liquid flow regulator. Thus, the flow rate of the first precursor to the mixing chamber can be suitably controlled. A second fluid connection is provided between the second precursor vessel and the mixing chamber. The second fluid connection is provided with a second liquid flow regulator. Thus, the flow rate of the second precursor to the mixing chamber can be suitably controlled. The method further comprises providing the first precursor in liquid form to the mixing chamber. The method further comprises providing the second precursor in liquid form to the mixing chamber. The method further comprises controlling the first liquid flow regulator to provide a pre-determined first flow rate of first precursor to the mixing chamber. The method further comprises controlling the second liquid flow regulator to provide a pre-determined second flow rate of second precursor to the mixing chamber. Controlling of at least one of the first and second flow regulator can be suitably done by means of a controller. Optionally, the method further comprises a step of providing a carrier gas to the mixing chamber.

Suitably, a precursor mixture that is mixed according to a method as described herein can be provided to a reaction chamber. Suitably, the precursor mixture can be provided in the gaseous state. Thus, in some embodiments, at least one of the first precursor and the second precursor can be provided to the mixing chamber in a liquid state, and that precursor, or those precursors, can be evaporated in the mixing chamber to yield a gaseous precursor mixture that can be provided to the reaction chamber in the gaseous state.

The reaction chamber can be suitably comprised in the same vacuum system as the precursor module. In some embodiments, the precursor mixture is continuously provided to the reaction chamber. Thus, further described herein is a method of providing a precursor mixture to a reaction chamber. The method comprises mixing the first precursor and the second precursor in accordance with a method as described herein to form a precursor mixture. The method further comprises providing the precursor mixture to the reaction chamber.

Alternatively, a precursor mixture can be provided to a reaction chamber intermittently, i.e. in pulses, to a reaction chamber. In some embodiments, the precursor mixture is provided to the reaction chamber in a plurality of pulses. Alternatively, the precursor mixture can be provided to the reaction chamber continuously, i.e. in an uninterrupted precursor stream. For example, a pulse train can be provided to the reaction chamber when laminar flow and relatively short precursor mixture pipes are used, whereas a substantially continuous precursor stream can be provided to the reaction chamber when at least one of turbulent flow and relatively long precursor mixture pipes are used. Thus, further described herein is a method of providing a precursor mixture to a reaction chamber. The method comprises executing one or more mixing cycles, such as a plurality of mixing cycles. For example, the method can comprise from at least 2 to at most 5 mixing cycles, or from at least 5 to at most 10 mixing cycles, or from at least 10 to at most 20 mixing cycles, or from at least 20 to at most 50 mixing cycles, or from at least 50 to at most 100 mixing cycles, or from at least 100 to at most 200 mixing cycles, or from at least 200 to at most 500 mixing cycles, or from at least 500 to at most 1000 mixing cycles, or from at least 1000 to at most 2000 mixing cycles. A mixing cycle comprises mixing a first precursor and a second precursor in accordance with a method as described herein. Accordingly, a precursor mixture is formed. The method further comprises opening a mixing valve that is provided downstream of the mixing chamber and upstream of the reaction chamber. Accordingly, the precursor mixture is provided from the mixing chamber to the reaction chamber. The mixing valve can then be closed, which can mark the end of a mixing cycle.

The mixing valve can, for example, be provided on an exhaust port of the mixing chamber. Alternatively, the mixing valve can be provided on a precursor mixture line. The precursor mixture line is constructed and arranged to provide the precursor mixture to the reaction chamber when the mixing valve is in an open position.

In some embodiments, methods as described herein employ a first precursor vessel that is constructed and arranged for providing a first precursor in a gaseous state to the mixing chamber, and a second precursor vessel that is constructed and arranged for providing a second precursor in a liquid state to the mixing chamber.

Thus, further described herein is a method of mixing a first precursor and a second precursor. The method comprises providing a precursor module comprising a first precursor vessel, a second precursor vessel, and a mixing chamber. The first precursor vessel can comprise first precursor in a liquid or a solid state. The second precursor vessel can comprise second precursor in a liquid state. The precursor module can, for example, be comprised in a system as described herein. It shall be understood that the first precursor and the second precursor are different.

The method comprises maintaining the first precursor, which is comprised in the first precursor vessel, at a first precursor temperature.

The method further comprises providing a first fluid connection between the first precursor vessel and the mixing chamber.

The method further comprises providing a second fluid connection between the second precursor vessel and the mixing chamber.

The method further comprises providing the first precursor and the second precursor to the mixing chamber. The first precursor is provided to the mixing chamber in gaseous form. The second precursor is provided to the mixing chamber in the liquid state.

The method further comprises controlling, by a controller, the first precursor temperature and the flow rate of the second precursor. Thus, a first predetermined amount of first precursor is provided to the mixing chamber and a second predetermined amount of second precursor is also provided to the mixing chamber.

Methods as described herein of mixing precursors and of providing a precursor mixture to a reaction chamber can be advantageously used for filling a gap. Indeed, employing such a precursor mixture can advantageously allow filling gaps with a material such as a gap filling fluid that has a composition that is determined by the constituent precursors of the reaction mixture. Thus, further described herein is a method of filling a gap. The method comprises introducing a substrate in a reaction chamber. The substrate is provided with a gap. The method further comprises introducing a precursor mixture to the reaction chamber by means of a method as described herein. The method further comprises generating a plasma. The plasma can be generated in the reaction chamber, i.e. in a direct plasma configuration. Alternatively, indirect or remote plasmas can be used as well. The plasma results in oligomerization of the precursors comprises in the precursor mixture and in consequential formation of a gap filling fluid that at least partially fills the gap. The gap filling fluid can be used during manufacturing processes of various semiconductor devices including, but not limited to, cell isolation in 3D cross point memory devices, self-aligned via, dummy gate, reverse tone patterning, PC RAM isolation, cut hard mask, and DRAM storage node contact (SNC) isolation.

In some embodiments, the substrate comprises a plurality of gaps that can be simultaneously filled with the gap filling fluid. For example, a substrate can comprise from at least $10^6$ to at most $10^{12}$ gaps. The precursor mixture comprises a first precursor and a second precursor. The first precursor and the second precursor are different. In some embodiments, the first precursor and the second precursor each have a molar mass of at least 50 g/mol. Additionally or alternatively, the first precursor and the second precursor can each comprise at least one of an alkali metal, an alkaline earth metal, boron (B), aluminum (Al), carbon (C), and silicon (Si).

In some embodiments, the method includes entirely filling the gap with a gap filling fluid. In some embodiments, the method includes filling the gap with gap filling fluid without the formation of voids or seams. In other words, in some embodiments, the deposition according to the present methods is continued until the gap is fully filled with a material having filling capability, and substantially no voids or seams are formed in the filled gap. The presence or absence of voids or seams can be observed, for example, by studying the formed material in a scanning tunneling electron microscope.

In some embodiments, no gasses other than the first precursor, the second precursor, and a noble gas are introduced into the reaction chamber while forming the gap filling fluid.

Advantageously, the composition of gap filing fluids can be controlled by changing the relative amounts of the first precursor and the second precursor that are provided to the reaction chamber. Thus, in some embodiments, the first precursor is provided to the reaction chamber at a flow rate which is from at least 0.01 times to at most 100 times the flow rate at which the second precursor is provided to the reaction chamber. In some embodiments, the first precursor is provided to the reaction chamber at a flow rate which is from at least 0.01 times to at most 0.1 times, or from at least 0.1 times to at most 1 time, or from at least 1 time to at most 10 times, or from at least 10 times to at most 100 times the flow rate at which the second precursor is provided to the reaction chamber.

The first precursor is different from the second precursor. The first precursor and the second precursor can comprise the same elements, but in a different amount. Alternatively, the first precursor and the second precursor can comprise different elements. For example, in some embodiments, the first precursor comprises a first element, the second precursor comprises a second element, the first element and the second element are different, and the first element and the second element are incorporated in the gap filling fluid. In some embodiments, the first precursor and the second precursor have a molar mass of at least 50 g/mol. Additionally or alternatively, and in some embodiments, the first precursor and the second precursor can comprise one or more of an alkali metal, an alkaline earth metal, a halogen, boron (B), aluminum (Al), carbon (C), and silicon (Si). Suitable alkali metals include Li, Na, K, Rb, and Cs. Suitable alkaline earth metals include Be, Mg, Ca, Sr, and B. Suitable halogens include F, CI, Br, and I.

In some embodiments, the first precursor comprises a first element and the second precursor comprises a second element. The first element and the second element are different. Also, the first element and the second element are incorporated in the gap filling fluid.

In some embodiments, at least one of the first element and the second element is selected from Si, C, O, N, and B.

In some embodiments, at least one of the first precursor and the second precursor comprises a metal precursor. Thus, in some embodiments, the first precursor comprises a metal precursor. Additionally or alternatively, the second precursor can comprise a metal precursor. In some embodiments, the first precursor and the second precursor comprise a metal precursor. It shall be understood that the metal precursor comprises a metal. Thus, in some embodiments, at least one of the first element and the second element comprises a metal.

In some embodiments, at least one of the first element and the second element is a metal such as a transition metal, a post transition metal, or a rare earth metal.

In some embodiments, at least one of the first element and the second element is a transition metal. Suitable transition metals include Sc, Ti, V, Cr, Mn, Fe, Co, Ni, Cu, Zn, Y, Zr, Nb, Mo, Tc, Ru, Rh, P, Ag, Cd, Lu, Hf, Ta, W, Re, Os, Ir, Pt, Au, and Hg. In some embodiments, the transition metal is selected from Hf, V, and Mo.

In some embodiments, at least one of the first element and the second metal is a post transition metal. Suitable post transition metals include Al, Ga, In, Sn, Tl, Pb, and Bi.

In some embodiments, at least one of the first element and the second element is a rare earth metal. Suitable rare earth metal include lanthanides such as La, Ce, Pr, Nd, Pm, Sm, Eu, Gd, Tb, Dy, Ho, Er, Tm, and Yb.

Thus, in some embodiments, the first precursor comprises Ti and the second precursor comprises Si and C. Accordingly, gap filling fluids comprising Ti, Si, and C can be formed.

In some embodiments, the first precursor comprises Ti and the second precursor comprises Si and C. Accordingly, gap filling fluids comprising Ti, Si, and C can be formed.

In some embodiments, the first precursor comprises Ti and the second precursor comprises Si and C. Accordingly, gap filling fluids comprising Ti, Si, and C can be formed.

In some embodiments, the first precursor comprises Ti and the second precursor comprises Si, O, and C. Accordingly, gap filling fluids comprising Ti, Si, O, and C can be formed.

In some embodiments, the first precursor comprises Ta and the second precursor comprises Si and C. Accordingly, gap filling fluids comprising Ta, Si, and C can be formed.

In some embodiments, the first precursor comprises Ta and the second precursor comprises Si and C. Accordingly, gap filling fluids comprising Ta, Si, and C can be formed.

In some embodiments, the first precursor comprises Ta and the second precursor comprises Si, O, and C. Accordingly, gap filling fluids comprising Ta, Si, O, and C can be formed.

In some embodiments, the metal precursor is selected from the list consisting of: metal halides, metal alkyls, metal alkenyls, metal aryls, metal beta-diketonates, metal alkoxides, and metal aryloxides.

In some embodiments, the metal precursor is a homoleptic precursor.

In some embodiments, the metal precursor is a heteroleptic precursor. For example, the precursor can comprise two different alkyl ligands, or two different aromatic ligands, or two different beta-diketonate ligands, or two different alkoxide ligands, or two different aryloxide ligands. In some embodiments, the metal precursor comprises a first ligand and a second ligand, wherein the first ligand and the second ligand respectively contain a first functional group and a second functional group, wherein the first functional group and the second functional group are different.

In some embodiments, the first precursor comprises a metal alkyl, such as a homoleptic metal alkyl. Examples of metal alkyls include methyls, ethyls, propyls, butyls, and pentyls. An exemplary butyl is isobutyl.

In some embodiments, the first precursor comprises a metal alkylamine, such as a homoleptic metal alkylamine. Examples of metal alkylamines include methylamines, ethylamines, propylamines, and butylamines. An exemplary metal allylamine is tetra(dimethylamino)titanium.

In some embodiments, the second precursor comprises an alkyl-substituted benzene. Such as a benzene with 1, 2, 3, 4, 5, or 6 alkyl substituents. Suitable alkyl substituents include methyl, ethyl, propyl, butyl, and pentyl. An exemplary alkyl-substituted benzene is toluene.

In some embodiments, the first precursor comprises a metal alkylamine such as tetrakis(dimethylamino)titanium, tetrakis(dimethylamino)hafnium, and tetrakis(dimethylamino)zirconium; and the second precursor comprises an alkyl-substituted benzene such as toluene.

In some embodiments, the first or second precursor comprises a tantalum precursor. Suitable tantalum precursors include tantalum alkylamines such as tantalum alkylamines comprising at least two different alkylamine ligands. In other words, and in some embodiments, the tantalum precursor is a heteroleptic alkylamine. Suitable tantalum alkylamines include Tris(diethylamido)(tert-butylimido)tantalum(V). Such tantalum alkylamines can be especially suitable when combined with a second precursor that comprises an alkyl-substituted aromatic hydrocarbon such as toluene. Accordingly, a gap filling fluid comprising Ta, N, and C can be formed.

In some embodiments, the first or second precursor comprises a siloxane. In some embodiments, the siloxane comprises one or more alkyl substituents. In some embodiments, the siloxane comprises one or more alkoxy substituents. In some embodiments, the siloxane comprises one or more alkyl and one or more alkoxy substituents. In some embodiments, the siloxane comprises 1,1,3,3-tetramethyl-1,3-dimethoxydisiloxane or an isomer thereof. Such siloxanes can be especially suitable when combined with a second precursor that comprises an alkyl-substituted aromatic hydrocarbon such as toluene. Accordingly, a gap filling fluid comprising Si, O, and C can be formed.

In some embodiments, the first or second precursor comprises an alkylamine-substituted halogenated alkane or alkene, such as an alkylamine-substituted fluorinated alkane or alkene. Examples of alkylamine-substituted alkanes include N,N-diethyl-(1,1,2,3,3,3-hexafluoropropyl)amine.
Examples of alkylamine-substituted alkenes include N,N-diethyl-(E)-pentafluoropropenylamine. Such precursors can be suitably combined with a tantalum precursor as described herein. Accordingly, a gap filling fluid comprising N, C, and Ta can be suitably formed.

In some embodiments, the first or second precursor comprises a lithium precursor. Suitable lithium precursors include alkoxides such as Li(OtBu), beta diketonates such as Li(thd), and alkylsilylamines such as $LiN(SiMe_3)_2$, alkylsilanolates such as $LiOSiMe_3$, and alkylsilazides such as $LiN(SiMe_3)_2$.

In some embodiments, the first or second precursor comprises a beryllium precursor. Suitable beryllium precursors include alkyls such as $Be(Me)_2$ and $Be(Et)_2$.

In some embodiments, the first or second precursor comprises a boron precursor. Suitable boron precursors include alkylamines such as $B(NMe_2)_3$ and $B(NEtMe)_3$, alkoxides such as $B(OMe)_3$, and halides such as $BCl_3$ and $BBr_3$.

In some embodiments, the first or second precursor comprises a carbon precursor. Suitable carbon precursors include halides such as $CBr_4$ and $CCl_3$.

In some embodiments, the first or second precursor comprises a sodium precursor. Suitable sodium precursors include alkoxides such as $Na(O^tBu)$, alkylsilanolates such as $NaOSiMe_3$, and beta-diketonates such as Na(thd).

In some embodiments, the first or second precursor comprises a magnesium precursor. Suitable magnesium precursors include alkyl-substituted cyclodienyls such as $Mg(EtCp)_2$, beta-diketonates such as $Mg(thd)_2$, and unsubstituted cyclodienyls such as $MgCp_2$.

In some embodiments, the first or second precursor comprises an aluminum precursor. Suitable aluminum precursors include halides such as $AlCl_3$, alkyls such as $AlMe_3$, alkoxides such as $Al(O^iPr)_3$, amidinates such as $Al(^iPrAMD)Et_2$, alkylamines such as $Al(NEt_2)_2(C_3H_6NMe_2)$ and $Al(NEt_2)_3$, alkoxides such as 1-methoxy-2-methyl-2-propoxide, and heteroleptic precursors such as $AlMe_2Cl$.

In some embodiments, the first or second precursor comprises a silicon precursor. Suitable silicon precursors include halosilanes such as $Si_2Cl_6$, higher order silanes such as disilane and trisilane, silylamines such as $N(Si_2H_5)_3$, and heteroleptic precursors such as $SiCl_2Me_2$.

In some embodiments, the first or second precursor comprises a phosphorous precursor. Suitable phosphorous precursors include halides such as $PCl_3$ and oxyhalides such as $POCl_3$.

In some embodiments, the first or second precursor comprises a potassium precursor. Suitable potassium precursors include alkoxides such as KOtBu.

In some embodiments, the first or second precursor comprises a calcium precursor. Suitable calcium precursors include beta-diketonates such as $Ca(hfac)_2$ and $Ca(thd)_2$, and alkyl-substituted cyclodienes such as $Ca(iPr_3Cp)_2$.

In some embodiments, the first or second precursor comprises a scandium precursor. Suitable scandium precursors include substituted or unsubstituted cyclodienes such as $Sc(iPrCp)_3$ and $ScCp_3$, and heteroleptic precursors such as $Sc(MeCp)_2$ $(Me_2pz)$.

In some embodiments, the first or second precursor comprises a titanium precursor. Suitable titanium precursor include halides such as $TiCl_4$, alkyls such as $Ti(Np)_4$, and alkylamines such as $Ti(Et_2)_4$.

In some embodiments, the first or second precursor comprises a vanadium precursor. Suitable vanadium. precursors included betadicetonates such as $VO(acac)_2$, alkylamines such as $V(NEt_2)_4$, amidinates such as $V(^iPrAMD)_3$, alkoxides such as $VO(O^iPr)_3$, and halides such as $VCl_4$.

In some embodiments, the first or second precursor comprises a chromium precursor. Suitable chromium precursors include beta-diketonates such as $Cr(acac)_3$ and halides such as $CrO_2Cl_2$.

In some embodiments, the first or second precursor comprises a manganese precursor. Suitable manganese precursors include alkyl-substituted cyclodienyls such as $Mn(EtCp)_2$ and $Mn(MeCp)_2$, amidinates such as $Mn(^tBuAMD)_2$, and beta-diketonates such as $Mn(thd)_3$.

In some embodiments, the first or second precursor comprises an iron precursor. Suitable iron precursors include amidinates such as $Fe(^tBuAMD)_2$, beta-diketonates such as $Fe(acac)_3$, and cyclodienyls such as $Fe(Cp)_2$.

In some embodiments, the first or second precursor comprises a cobalt precursor. Suitable cobalt precursors include diazadienes such as such as $Co(^tBu_2DAD)_2$, alkyl-substituted cyclodienes such as $Co(CpEt)_2$, and carbonyls such as $Co_2(CO)^8$.

In some embodiments, the first or second precursor comprises a nickel precursor. Suitable nickel precursors include beta-diketonates such as $Ni(acac)_2$, cyclodienyls such as $Ni(Cp)_2$, and heteroleptic precursors such as $Ni(acac)_2(py)_2$.

In some embodiments, the first or second precursor comprises a copper precursor. Suitable copper precursors include beta-diketonates such as $Cu(acac)_2$ and amidinates such as $[Cu(iPrAMD)]_2$.

In some embodiments, the first or second precursor comprises a zinc precursor. Suitable zinc precursors include alkyls such as $ZnEt_2$ and halides such as $ZnCl_2$.

In some embodiments, the first or second precursor comprises a gallium precursor. Suitable gallium precursors include beta-diketonates such as $Ga(acac)_3$, alkyl-substituted cyclodienyls such as $Ga(CpMe_5)$, and alkyls such as $GaMe_3$ and $GaEt_3$.

In some embodiments, the first or second precursor comprises a germanium precursor. Suitable germanium precursors include germanes such as digermane, halogermanes such as tetrachlorogermane, and alkylgermanes such as diethylgermane.

In some embodiments, the first or second precursor comprises a rubidium precursor. Suitable rubidium precursors include alkoxides such as $RbO^tBu$.

In some embodiments, the first or second precursor comprises a strontium precursor. Suitable strontium precursors include alkyl-substituted cyclodienyls such as $Sr(Cp_iPr_3)_2$.

In some embodiments, the first or second precursor comprises an yttrium precursor. Suitable yttrium precursors include alkyl-substituted cyclodienyls such as $Y(Cp^iPr_3)_2$ and heteroleptic precursors such as $Y(EtCp)_2(^iPr_2AMD)$.

In some embodiments, the first or second precursor comprises a zirconium precursor. Suitable zirconium precursors include alkylamines such as $Zr(NEtMe)_4$ and alkoxides such as $Zr(O^tBu)_4$.

In some embodiments, the first or second precursor comprises a niobium precursor. Suitable niobium precursors include heteroleptic precursors such as $Nb(N^tBu)(NEt_2)_2(Cp)$, alkoxides such as $Nb(OEt)_5$, and halides such as $NbCl_5$.

In some embodiments, the first or second precursor comprises a molybdenum precursor. Suitable molybdenum precursors include halides such as $MoCl_5$, carbonyls such as $Mo(CO)_6$, and heteroleptic precursors such as $MoCp(CO)_2(NO)$.

In some embodiments, the first or second precursor comprises a ruthenium precursor. Suitable ruthenium precursors include alkyl-substituted cyclodienyls such as $Ru(CpEt)_2$ and $Ru(CpEtMe)_2$.

In some embodiments, the first or second precursor comprises a rhodium precursor. Suitable rhodium precursors include beta-diketonates such as $Rh(acac)_3$.

In some embodiments, the first or second precursor comprises a palladium precursor. Suitable palladium precursors include beta-diketonates such as $Pd(hfac)_2$.

In some embodiments, the first or second precursor comprises a silver precursor. Suitable silver precursors include heteroleptic precursors such as $Ag(hfac)(PMe_3)$.

In some embodiments, the first or second precursor comprises a cadmium precursor. Suitable cadmium precursors include alkyls such as $CdMe_2$.

In some embodiments, the first or second precursor comprises an indium precursor. Suitable indium precursors include beta-diketonates such as $In(acac)_3$.

In some embodiments, the first or second precursor comprises a tin precursor. Suitable tin precursors include halides such as $SnCl_4$.

In some embodiments, the first or second precursor comprises a cesium precursor. Suitable cesium precursors include alkoxides such as $CsO^tBu$.

In some embodiments, the first or second precursor comprises a barium precursor. Suitable barium precursors include alkyl-substituted cyclodienyls such as $Ba(CpMe_5)_2$.

In some embodiments, the first or second precursor comprises a lanthanum precursor. Suitable lanthanum precursors include alkyl-substituted or unsubstituted cyclodienyls such as $La(Cp)_3$ and $La(CpEt)_3$.

In some embodiments, the first or second precursor comprises a cerium precursor. Suitable cerium precursors include beta-diketonates such as $Ce(thd)_4$ and alkyl-substituted cyclodienyls such as $Ce(^iPrCp)_3$.

In some embodiments, the first or second precursor comprises a praseodymium precursor. Suitable praseodymium precursors include alkyl-substituted cyclodienyls such as $Pr(Cp^iPr)_3$.

In some embodiments, the first or second precursor comprises a neodymium precursor. Suitable neodymium precursors include beta-diketonates such as $Nd(thd)_3$.

In some embodiments, the first or second precursor comprises a samarium precursor. Suitable samarium precursors include beta-diketonates such as $Sm(thd)_3$.

In some embodiments, the first or second precursor comprises a europium precursor. Suitable europium precursors include beta-diketonates such as $Eu(thd)_3$.

In some embodiments, the first or second precursor comprises a gadolinium precursor. Suitable gadolinium precursors include alkyl-substituted cyclodienyls such as $Gd(CpMe)_3$.

In some embodiments, the first or second precursor comprises a terbium precursor. Suitable terbium precursors include beta-diketonates such as $Tb(thd)_3$.

In some embodiments, the first or second precursor comprises a dysprosium precursor. Suitable dysprosium precursors include beta-diketonates such as $Dy(thd)_3$.

In some embodiments, the first or second precursor comprises a holmium precursor. Suitable holmium precursors include beta-diketonates such as $Ho(thd)_3$.

In some embodiments, the first or second precursor comprises an erbium precursor. Suitable erbium precursors include beta-diketonates such as $Er(thd)_3$.

In some embodiments, the first or second precursor comprises a thulium precursor. Suitable thulium precursors include cyclodienyls such as $TmCp_3$.

In some embodiments, the first or second precursor comprises an ytterbium precursor. Suitable ytterbium precursors include alkyl-substituted cyclodienyls such as $Yb(MeCp)_3$.

In some embodiments, the first or second precursor comprises a lutetium precursor. Suitable lutetium precursors include alkoxides such as $Lu(O^iPr)_3$.

In some embodiments, the first or second precursor comprises a hafnium precursor. Suitable hafnium precursors include alkylamines such as $Hf(NEtMe)_4$.

In some embodiments, the first or second precursor comprises a tantalum precursor. Suitable tantalum precursors include halides such as $TaCl_5$.

In some embodiments, the first or second precursor comprises a tungsten precursor. Suitable tungsten precursors include halides such as $WCl_6$.

In some embodiments, the first or second precursor comprises a rhenium precursor. Suitable rhenium precursors include halides such as $ReCl_5$.

In some embodiments, the first or second precursor comprises an osmium precursor. Suitable osmium precursors include cyclodienyls such as $OsCp_2$.

In some embodiments, the first or second precursor comprises an iridium precursor. Suitable iridium precursors include beta-diketonates such as $Ir(acac)_3$.

In some embodiments, the first or second precursor comprises a platinum precursor. Suitable platinum precursors include beta-diketonates such as $Pt(acac)_2$.

In some embodiments, the first or second precursor comprises a gold precursor. Suitable gold precursors include heteroleptic precursors such as $Au(PMe_3)Me_3$.

In some embodiments, the first or second precursor comprises a mercury precursor. Suitable mercury precursors include alkyls such as $HgMe_2$.

In some embodiments, the first or second precursor comprises a lead precursor. Suitable lead precursors include precursors having an aromatic ligand such as $PbPh_4$.

In some embodiments, the first or second precursor comprises a bismuth precursor. Suitable bismuth precursors include halides such as $BiCl_3$.

In some embodiments, at least one of the first precursor and the second precursor comprises a halogen. Suitable halogens include fluorides, chlorides, bromides, and iodides. For example, at least one of the first precursor and the second precursor can comprise a transition metal halide, such as a transition metal chloride, such as $TiCl_4$. For example, at least one of the first precursor and the second precursor can comprise a post transition metal halide, such as a post transition metal boride, such as $AlBr_3$.

In some embodiments, the reaction gas further comprises a third precursor. It shall be understood that the third precursor is different from the first precursor and from the second precursor. The third precursor comprises a third element. The third element is different from the first element and from the second element. When the reaction gas further comprises a third precursor, the third element can, in some embodiments, be incorporated in the gap filling fluid.

In some embodiments, the third precursor is selected from any one of the precursor listed as a possible first precursor or second precursor.

In some embodiments, the third element selected from Si, C, O, N, and B.

In some embodiments, the third element is a metal such as a transition metal, a post transition metal, or a rare earth metal.

In some embodiments, the third element is a transition metal. Suitable transition metals include Sc, Ti, V, Cr, Mn, Fe, Co, Ni, Cu, Zn, Y, Zr, Nb, Mo, Tc, Ru, Rh, P, Ag, Cd, Lu, Hf, Ta, W, Re, Os, Ir, Pt, Au, and Hg.

In some embodiments, the third element is a post transition metal. Suitable post transition metals include Al, Ga, In, Sn, Tl, Pb, and Bi.

In some embodiments, the third element is a rare earth metal. Suitable rare earth metal include lanthanides such as La, Ce, Pr, Nd, Pm, Sm, Eu, Gd, Tb, Dy, Ho, Er, Tm, and Yb.

In some embodiments, the third precursor comprises ammonia. In some embodiments, the first precursor comprises a silazane such as a silazane having the formula

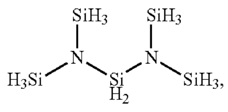

the second precursor comprises an alkyl-substituted benzene such as toluene, and the third precursor comprises ammonia.

In some embodiments, the reaction gas further comprises a fourth, fifth, or further precursor. For example, the reaction gas can contain multiple metal precursors. It shall be understood that the fourth, fifth, or further precursors are different from one another, and that they are different from the first precursor, the second precursor, and the third precursor. In some embodiments, the fourth, fifth, or further precursor is selected from any one of the precursors listed herein as possible first or second precursors.

In some embodiments, the first precursor comprises a carbon precursor, such as an alkyl-substituted benzene, such as toluene; the second precursor comprises a titanium precursor such as tetrakis(dimethylamido)titanium, and the third precursor comprises a tantalum precursor such as tris(diethylamido)(tert-butylimido)tantalum.

In some embodiments, at least one of the first precursor and the second precursor is selected from the list consisting of hydrocarbons, amines, amides, imides, silanes, alkylsilanes, siloxanes, and borazanes.

In some embodiments, at least one of the first precursor and the second precursor comprises a silicon precursor. In some embodiments, the silicon precursor comprises silicon and a halogen. In some embodiments, the silicon precursor has a general formula of $Si_nH_{2n+2-m}X_m$, wherein X is a halogen, n is from at least 1 to at most 3, and m is from at least 1 to at most 2n+2.3. In some embodiments, the halogen is selected from F, Cl, Br, and I. In other words, and in some embodiments, the silicon precursor is a halogenated silane. In some embodiments, the silicon precursor has a general formula of $Si_nH_{2n+2-m}I_m$, wherein n is from at least 1 to at most 3, and m is from at least 1 to at most 2n+2.5. In some embodiments, the silicon precursor comprises $SiI_2H_2$. In some embodiments, the silicon precursor consists of $SiI_2H_2$. In some embodiments, the silicon precursor substantially consists or substantially consists of silicon, hydrogen, and one or more halogens. It shall be understood that, when the silicon precursor consists of certain components, other components may, in some embodiments, still be present in small quantities, e.g. as contaminants.

In some embodiments, at least one of the first precursor and the second precursor comprises a carbon precursor. In some embodiments, the carbon precursor comprises carbon and hydrogen. Suitable carbon precursor include substituted or unsubstituted aromatic hydrocarbons, for example alkylbenzenes such as toluene and 1,2,4-trimethylbenzene.

In some embodiments, at least one of the first precursor and the second precursor comprises a silazane, such as trisilylamine or bis(disilylamino)silane. In some embodiments, at least one of the first precursor and the second precursor comprises an alkyl-substituted silazane such as bis(diethylamino)silane.

In some embodiments, at least one of the first precursor and the second precursor comprises a halosilane such as a fluorosilane, a chlorosilane, a bromosilane, or a iodosilane. In some embodiments, the halosilane comprises hexachlorodisilane. Accordingly, a gap filling fluid comprising Si can be formed.

In some embodiments, at least one of the first precursor and the second precursor comprises an alkylsilyl phosphite such as trimethylsilyl phosphite. Accordingly, a gap filling fluid comprising Si, O, C, and P can be formed.

In some embodiments, at least one of the first precursor and the second precursor comprises an alkylsilyl borate such as trimethylsilyl borate. Accordingly, a gap filling fluid comprising Si, O, C, and B can be formed.

In some embodiments, at least one of the first precursor and the second precursor comprises a silane such as trisilane. Accordingly, a gap filling fluid comprising Si can be formed.

In some embodiments, at least one of the first precursor and the second precursor comprises borazine. Accordingly, a gap filling fluid comprising B, N, and H can be formed.

In some embodiments, at least one of the first precursor and the second precursor comprises a silazane such as a compound having the following formula:

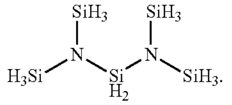

Accordingly, a gap filling fluid comprising Si and N can be formed.

In some embodiments, at least one of the first precursor and the second precursor comprises an alkyl-substituted benzene such as toluene. Accordingly, a gap filing fluid comprising C can be formed.

In some embodiments, at least one of the first precursor and the second precursor comprises a cyclic diene such as cyclopentadiene. Accordingly, a gap filling fluid comprising C can be formed.

In some embodiments, at least one of the first precursor and the second precursor comprises an alkylsilyl borate such as trimethylsilyl borate. Accordingly, a gap filling fluid comprising Si, O, C, and B can be formed.

In some embodiments, at least one of the first precursor and the second precursor comprises an alkyl-substituted cyclic silazane such as hexamethylcyclotrisilazane. Accordingly, a gap filling fluid comprising Si, C, and N can be formed.

In some embodiments, at least one of the first precursor and the second precursor comprises an alkyl-substituted linear silazane such as hexamethyldisilazane. Accordingly, a gap filling fluid comprising Si, C, and N can be formed.

In some embodiments, at least one of the first precursor and the second precursor comprises an alkyl and alkylsilyl-substituted hydrazine such as 1,1-bis(dimethylsilyl)-2,2-dimethylhydrazine. Accordingly, a gap filling fluid comprising Si, C, and N can be formed.

In some embodiments, at least one of the first precursor and the second precursor comprises an alkyl-substituted silane such as trimethylsilane. Accordingly, a gap filling fluid comprising Si and C can be formed.

In some embodiments, at least one of the first precursor and the second precursor comprises an alkyl and alkenyl-substituted silane such as dimethyldivinylsilane. Accordingly, a gap filling fluid comprising Si and C can be formed.

In some embodiments, at least one of the first precursor and the second precursor comprises an alkyl-substituted silane such as hexamethyldisilane. Accordingly, a gap filling fluid comprising Si and C can be formed.

In some embodiments, at least one of the first precursor and the second precursor comprises a halosilane such as diiodosilane or hexachlorodisilane. Accordingly, a gap filling fluid comprising Si can be formed.

In some embodiments, at least one of the first precursor and the second precursor comprises borazine. Accordingly, a gap filling fluid comprising B and N can be formed.

In some embodiments, at least one of the first precursor and the second precursor comprises a Si and N containing compound such as trisilylamine, N,N,N',N'-tetrasilyl-silanediamine, or $(SiH_3)_2—N—SiH_2—NH—SiH_2—N—(SiH_3)_2$. Accordingly, a gap filling fluid comprising Si and N can be formed.

In some embodiments, at least one of the first precursor and the second precursor comprises an alkylamine and alkyl-substituted cyclosiloxane such as 2-diethylamino-2,4,6,8-tetramethylcyclotetrasiloxane. Accordingly, a gap filling fluid comprising Si, O, C, and N can be formed.

In some embodiments, at least one of the first precursor and the second precursor comprises an alkyl-substituted cyclosiloxane such as octamethylcyclotetrasiloxane, 2,4,6,8-tetramethylcyclotetrasiloxane, or decamethylcyclopentasiloxane. Accordingly, a gap filling fluid comprising Si, O, and C can be formed.

In some embodiments, at least one of the first precursor and the second precursor comprises a tertiary amine comprising one or more alkyl chains and one or more haloalkyl chains. Examples of such compounds include N,N-diethyl-(1,1,2,3,3,3-hexafluoropropyl)amine and N,N-diethyl-(E)-pentafluoropropenylamine. Accordingly, gap filling fluids comprising C, N, and a halogen such as F can be formed.

In some embodiments, at least one of the first precursor and the second precursor comprises an alkyl-, alkoxy and alkenyl-substituted silane such as dimethoxymethylvinylsilane. Accordingly, a gap filling fluid comprising Si, O, and C can be formed.

In some embodiments, at least one of the first precursor and the second precursor comprises an unsaturated cyclic hydrocarbon such as cyclopentadiene. Accordingly, a gap filling fluid comprising C can be formed.

In some embodiments, at least one of the first precursor and the second precursor comprises an unsaturated aliphatic hydrocarbon such as ethene. Accordingly, a gap filling fluid comprising C can be formed.

In some embodiments, at least one of the first precursor and the second precursor comprises a halogenated borazine such as hexachloroborazine. Accordingly, a gap filling fluid comprising B and N can be formed.

In some embodiments, at least one of the first precursor and the second precursor comprises a linear or cyclic higher order silane such as trisilane, neopentasilane, tetrasilane, neopentasilane, or cyclohexasilane. Accordingly, a gap filling fluid comprising Si can be formed.

In some embodiments, at least one of the first precursor and the second precursor comprises a linear or cyclic siloxane such as dodecamethylhexasiloxane. Accordingly, a gap filling fluid comprising Si, O, and C can be formed.

In some embodiments, at least one of the first precursor and the second precursor comprises a cyclic or linear silazane such as hexamethyldisilazane. Accordingly, a gap filling fluid comprising Si, N, and C can be formed.

In some embodiments, at least one of the first precursor and the second precursor comprises an organosilicon compound comprising one or more alkyl substituents, and optionally comprising one or more unsaturated bonds such as 1,1-methylvinyldisilane. Accordingly, a gap filling fluid comprising Si and C can be formed.

In some embodiments, at least one of the first precursor and the second precursor comprises carbon (C). In some embodiments, at least one of the first precursor and the second precursor comprises silicon (Si). In some embodiments, at least one of the first precursor and the second precursor comprises Si and C. In some embodiments, at least one of the first precursor and the second precursor comprises Si, C, and oxygen (O). In some embodiments, at least one of the first precursor and the second precursor comprises Si, C, and nitrogen (N). In some embodiments, at least one of the first precursor and the second precursor comprises Si and N. In some embodiments, at least one of the first precursor and the second precursor comprises N and boron (B). In some embodiments, at least one of the first precursor and the second precursor comprises C, O, and N.

Advantageously, employing a first precursor that comprises B, N, and H; and a second precursor that comprises C, O, N, and H can allow forming gap filling fluids that comprise B, N, C, O, and H. The present methods can be particularly advantageous for controlling the composition of such gap filling fluids.

Advantageously, employing a first precursor that comprises Si and H; and a second precursor that comprises C, O, N, and H can allow forming gap filling fluids that comprise Si, C, O, N, and H. The present methods can be particularly advantageous for controlling the composition of such gap filling fluids.

Advantageously, employing a first precursor that comprises Si and H; and a second precursor that comprises B, N, and H can allow forming gap filling fluids that comprise Si, B, N, and H. The present methods can be particularly advantageous for controlling the composition of such gap filling fluids.

Advantageously, employing a first precursor that comprises Si, N, and H; and a second precursor that comprises C, O, N, and H can allow forming gap filling fluids that comprise Si, N, C, O, and H. The present methods can be particularly advantageous for controlling the composition of such gap filling fluids.

Advantageously, employing a first precursor that comprises Si, N, and H; and a second precursor that comprises B, N, and H can allow forming gap filling fluids that comprise Si, B, N, and H. The present methods can be particularly advantageous for controlling the composition of such gap filling fluids.

Advantageously, employing a first precursor that comprises Si, N, and H; and a second precursor that comprises Si and H can allow forming gap filling fluids that comprise Si, N, and H. The present methods can be particularly advantageous for controlling the composition of such gap filling fluids.

Advantageously, employing a first precursor that comprises Si, C, N, and H; and a second precursor that comprises C, O, N, and H can allow forming gap filling fluids that comprise Si, C, N, O, and H. The present methods can be particularly advantageous for controlling the composition of such gap filling fluids.

Advantageously, employing a first precursor that comprises Si, C, N, and H; and a second precursor that comprises B, N, and H can allow forming gap filling fluids that comprise Si, C, B, N, and H. The present methods can be particularly advantageous for controlling the composition of such gap filling fluids.

Advantageously, employing a first precursor that comprises Si, C, N, and H; and a second precursor that comprises Si and H can allow forming gap filling fluids that comprise Si, C, N, and H. The present methods can be particularly advantageous for controlling the composition of such gap filling fluids.

Advantageously, employing a first precursor that comprises Si, C, N, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises Si, C, O, and H; and a second precursor that comprises C, O, and N can allow forming gap filling fluids that comprise Si, C, O, N, and H. The present methods can be particularly advantageous for controlling the composition of such gap filling fluids.

Advantageously, employing a first precursor that comprises Si, C, O, and H; and a second precursor that comprises B, N, and H can allow forming gap filling fluids that comprise Si, C, O, B, N, and H. The present methods can be particularly advantageous for controlling the composition of such gap filling fluids.

Advantageously, employing a first precursor that comprises Si, C, O, and H; and a second precursor that comprises Si and H can allow forming gap filling fluids that comprise Si, C, O, and H. The present methods can be particularly advantageous for controlling the composition of such gap filling fluids.

Advantageously, employing a first precursor that comprises Si, C, O, and H; and a second precursor that comprises Si and N can allow forming gap filling fluids that comprise Si, C, O, N, and H. The present methods can be particularly advantageous for controlling the composition of such gap filling fluids.

Advantageously, employing a first precursor that comprises Si, C, O, and H; and a second precursor that comprises Si, C, N, and H can allow forming gap filling fluids that comprise Si, C, O, N, and H. The present methods can be particularly advantageous for controlling the composition of such gap filling fluids.

Advantageously, employing a first precursor that comprises C, and H; and a second precursor that comprises C, O, N, and H can allow forming gap filling fluids that comprise C, O, N, and H. The present methods can be particularly advantageous for controlling the composition of such gap filling fluids.

Advantageously, employing a first precursor that comprises C, and H; and a second precursor that comprises B, N, and H can allow forming gap filling fluids that comprise B, C, and N. The present methods can be particularly advantageous for controlling the composition of such gap filling fluids.

Advantageously, employing a first precursor that comprises C, and H; and a second precursor that comprises Si and H can allow forming gap filling fluids that comprise Si, C, and H. The present methods can be particularly advantageous for controlling the composition of such gap filling fluids.

Advantageously, employing a first precursor that comprises C, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises C, and H; and a second precursor that comprises Si, C, N, and H can allow forming gap filling fluids that comprise Si, C, N, and H. The present methods can be particularly advantageous for controlling the composition of such gap filling fluids.

Advantageously, employing a first precursor that comprises C, and H; and a second precursor that comprises Si, C, O, and H can allow forming gap filling fluids that comprise Si, C, O, and H. The present methods can be particularly advantageous for controlling the composition of such gap filling fluids.

Advantageously, employing a first precursor that comprises Si, C, and H; and a second precursor that comprises C, O, and N can allow forming gap filling fluids that comprise Si, C, O, N, and H. The present methods can be particularly advantageous for controlling the composition of such gap filling fluids.

Advantageously, employing a first precursor that comprises Si, C, and H; and a second precursor that comprises B, N, and H can allow forming gap filling fluids that comprise Si, B, N, C, and H. The present methods can be particularly advantageous for controlling the composition of such gap filling fluids.

Advantageously, employing a first precursor that comprises Si, C, and H; and a second precursor that comprises Si and H can allow forming gap filling fluids that comprise Si, C, and H. The present methods can be particularly advantageous for controlling the composition of such gap filling fluids.

Advantageously, employing a first precursor that comprises Si, C, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises Si, C, and H; and a second precursor that comprises Si, N, C, and H can allow forming gap filling fluids that comprise Si, N, C, and H. The present methods can be particularly advantageous for controlling the composition of such gap filling fluids.

Advantageously, employing a first precursor that comprises Si, C, and H; and a second precursor that comprises Si, C, O, and H can allow forming gap filling fluids that comprise Si, C, O, and H. The present methods can be particularly advantageous for controlling the composition of such gap filling fluids.

Advantageously, employing a first precursor that comprises Si, C, and H; and a second precursor that comprises C, and H can allow forming gap filling fluids that comprise Si, C, and H. The present methods can be particularly advantageous for controlling the composition of such gap filling fluids.

In some embodiments, at least one of the first precursor and the second precursor is supplied to the reaction chamber by means of a carrier gas, i.e. as a gas that entrains the precursor, and/or as an additional gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. These exemplary carrier gas flow rates are provided for the case when the substrate is a 300 mm wafer. Flow rates for other wafer sizes can be trivially derived from these flow rates. Suitable carrier gasses include noble gasses such as He, Ne, Ar, and Kr. It shall be understood that a carrier gas refers to a gas that carries, or entrains, a precursor to the reaction chamber. An exemplary carrier gas includes a noble gas such as argon.

In some embodiments, the reaction gas further comprises $H_2$. It shall be understood that when a noble gas such as argon is not substantially incorporated in the gap filling fluid. This notwithstanding, when the reaction gas comprises $H_2$, hydrogen may be incorporated in the gap filling fluid.

In some embodiments, the present methods comprise providing at least one of the first, second, or third precursor intermittently to the reaction space, and continuously applying a plasma. Thus, in some embodiments, a continuous plasma is used instead of plasma pulses. In some embodiments, the present methods involve providing at least one of the first, second, or third precursor intermittently to the reaction space, and intermittently generating a plasma.

In some embodiments, at least one of the first, second, and third precursor is continuously provided to the reaction chamber whereas a plasma is generated intermittently.

In some embodiments, the present methods comprise continuously providing at least one of the first, second, and third precursor to the reaction chamber, and continuously generating a plasma in the reaction chamber, e.g. through application of RF power, while forming the gap filling fluid.

In some embodiments, the plasma is generated intermittently. In some embodiments, a pulsed plasma, e.g. a pulsed RF plasma is generated in the reaction chamber. Thus, the method comprises a plurality of cycles, a cycle comprising a plasma on pulse and a plasma off pulse. In some embodiments, a plasma on pulse lasts from at least 0.7 seconds to at most 2.0 seconds, for example from at least 0.7 seconds to at most 1.5 seconds. In some embodiments, a plasma off pulse lasts from at least 0.7 seconds to at most 2.0 seconds, for example from at least 0.7 seconds to at most 1.5 seconds.

In some embodiments, the plasma is generated continuously.

In some embodiments, at least one of the first precursor and the second precursor is intermittently provided to the reaction chamber.

In some embodiments, at least one of the first precursor and the second precursor is continuously provided to the reaction chamber.

Advantageously, the elemental composition and the physical properties of a gap filling fluid formed by means of an embodiment of a method as described herein can be controlled by controlling precursor mixture composition, pulse times, inter-pulse interval durations, precursor flow rates, plasma parameters, source temperatures, carrier gas flow rates, and the like.

In some embodiments, forming the gap filling fluid comprises executing a cyclical deposition process. The cyclical deposition process comprises executing a plurality of deposition cycles. A deposition cycle can comprise a precursor pulse and a plasma pulse. The precursor pulse comprises introducing at least one of the first, second, and third precursor into the reaction chamber. The plasma pulse comprises generating a plasma in the reaction chamber Thus, a gap filling fluid can be formed that fills the gap at least to some extent. If desired, the deposition cycle can be repeated one or more times until a suitable amount of gap filling fluid has been formed in the gap.

In some embodiments, a method as described herein comprises from at least 10 to at most 30000 deposition cycles, or from at least 10 to at most 3000 deposition cycles, or from at least 10 to at most 1000 deposition cycles, or from at least 10 to at most 500 deposition cycles, or from at least 20 to at most 200 deposition cycles, or from at least 50 to at most 150 deposition cycles, or from at least 75 to at most 125 deposition cycles, for example 100 deposition cycles.

In some embodiments, the precursor pulse and the plasma pulse at least partially overlap. In other words, and in some embodiments, the precursor pulse and the plasma pulse occur at least partially simultaneously. In such embodiments, the cyclical deposition process does not contain an intra-cycle purge. In some embodiments, the cyclical deposition process does not contain an inter-cycle purge.

In some embodiment, the reaction chamber is not purged between the precursor pulse and the plasma pulse. Nevertheless, in some embodiments, the precursor pulse and the plasma pulse can be separated by an intra-cycle purge. Note that, in this case, the intra-cycle purge is kept sufficiently short such as not to dilute the precursor concentration in the reaction chamber to an appreciable extent. In other words, the duration of the purge steps and the flow rate of purge gas is selected to be sufficiently low as to ensure that not all precursor has been removed from the reaction chamber after the purge step has finished. In other words, the duration of the purge steps and purge gas flow rates used therein can be sufficiently low such that the entire reaction chamber is not evacuated during a purge step.

In some embodiments, the duration of the precursor pulse is from at least 0.25 s to at most 4.0 s, or from at least 0.5 s to at most 2.0 s, or from at least 1.0 s to at most 1.5 s.

In some embodiments, the duration of the intra-cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, the RF on time, i.e. the duration of a plasma pulse, that is the time during which RF power is provided during a plasma pulse, is from at least 0.5 s to at most 4.0 s, or from at least 0.7 s to at most 3.0 s, or from at least 1.0 s to at most 2.0 s, or from at least 1.25 s to at most 1.75 s, or of about 1.5 s.

In some embodiments, the inter-cycle purge has a duration from at least 0.1 s to at most 2.0 s, or from at least 0.1 to at most 1.5 s for example 1.0 s.

In some embodiments, the plasma pulses comprise generating an RF plasma in the reaction chamber. In some embodiments, a plasma power of at least 10 W to at most 500 W is used during the plasma pulses. In some embodiments, a plasma power of at least 20 W to at most 150 W is used during the plasma pulses. In some embodiments, a plasma power of at least 30 W to at most 100 W is used during the plasma pulses. In some embodiments, a plasma power of at least 35 W to at most 75 W is used during the plasma pulses. In some embodiments, a plasma power of at least 40 W to at most 50 W is used during the plasma pulses.

In some embodiments, a plasma frequency of at least 40 kHz to at most 2.45 GHz is used for generating the plasma, or a plasma frequency of at least 40 kHz to at most 80 kHz is used for generating the plasma, or a plasma frequency of at least 80 kHz to at most 160 kHz is used for generating the plasma, or a plasma frequency of at least 160 kHz to at most 320 kHz is used for generating the plasma, or a plasma frequency of at least 320 kHz to at most 640 kHz is used for generating the plasma, or a plasma frequency of at least 640 kHz to at most 1280 kHz is used for generating the plasma, or a plasma frequency of at least 1280 kHz to at most 2500 kHz is used for generating the plasma, or a plasma frequency of at least 2.5 MHz to at least 5 MHz is used is used for generating the plasma, or a plasma frequency of at least 5 MHz to at most 50 MHz is used is used for generating the plasma, or a plasma frequency of at least 5 MHz to at most 10 MHz is used is used for generating the plasma, or a plasma frequency of at least 10 MHz to at most 20 MHz is used is used for generating the plasma, or a plasma frequency of at least 20 MHz to at most 30 MHz is used is used for generating the plasma, or a plasma frequency of at least 30 MHz to at most 40 MHz is used is used for generating the plasma, or a plasma frequency of at least 40 MHz to at most 50 MHz is used is used for generating the plasma, or a plasma frequency of at least 50 MHz to at most 100 MHz is used is used for generating the plasma, or a plasma frequency of at least 100 MHz to at most 200 MHz is used is used for generating the plasma, or a plasma frequency of at least 200 MHz to at most 500 MHz is used is used for generating the plasma, or a plasma frequency of at least 500 MHz to at most 1000 MHz is used is used for generating the plasma, or a plasma frequency of at least 1 GHz to at most 2.45 GHz is used is used for generating the plasma. In exemplary embodiments, the plasma is an RF plasma, and RF power is provided at a frequency of 13.56 MHz.

In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10,000 nm, or of at least 20 nm to at most 5,000 nm, or from at least 40 nm to at most 2,500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10,000 nm, or of at least 20 nm to at most 5,000 nm, or from at least 40 nm to at most 2,500 nm, or from at least 80 nm to at most 1000 nm, or from at least 100 nm to at most 500 nm, or from at least 150 nm to at most 400 nm, or from at least 200 nm to at most 300 nm.

In some embodiments, the gap filling fluid extends into a particular gap for a distance that equals from at least 1.0 to at most 10.0 times the width of the gap. In some embodiments, the gap filling fluid extends into a particular gap for a distance that equals from at least 1.5 to at most 9.0 times the width of the gap. In some embodiments, the gap filling fluid extends into a particular gap for a distance that equals from at least 2.0 to at most 8.0 times the width of the gap. In some embodiments, the gap filling fluid extends into a particular gap for a distance that equals from at least 3.0 to at most 6.0 times the width of the gap. In some embodiments, the gap filling fluid extends into a particular gap for a distance that equals from at least 4.0 to at most 6.0 times the width of the gap. In some embodiments, the gap filling fluid extends into a particular gap for a distance that equals about 5.0 times the width of the gap. In other words, and in some embodiments, the gap filling fluid fills the gap up to any one of the aforementioned distances from the bottom of the gap.

In some embodiments, a method as described herein is carried out at a temperature of at least −25° C. to at most 150° C. In some embodiments, the present methods are executed at a temperature of at least −25° C. to at most 200° C. In some embodiments, the present methods are executed at a temperature of at least −25° C. to at most 0° C. In some embodiments, the present methods are executed at a temperature of at least 0° C. to at most 25° C. In some embodiments, the present methods are executed at a temperature of at least 25° C. to at most 50° C. In some embodiments, the present methods are executed at a temperature of at least 50° C. to at most 75° C. In some embodiments, the present methods are executed at a temperature of at least 75° C. to at most 150° C. In some embodiments, the present methods are executed at a temperature of at least 150° C. to at most 200° C.

In some embodiments, a method as described herein is carried out at a pressure of at least 500 Pa. In some embodiments, the reaction chamber is maintained at a pressure of at least 600 Pa to at most 10000 Pa. For example, the pressure in the reaction chamber may be maintained at a pressure of at least 600 Pa to at most 1200 Pa, or at a pressure of at least 1200 Pa to at most 2500 Pa, or at a pressure of at least 2500 Pa to at most 5000 Pa, or at a pressure of at least 5000 Pa to at most 10000 Pa. This enhances the gap filling properties of the presently provided gap filling fluids.

In some embodiments, a method as described herein is carried out at a pressure of at least 500 Pa to at most 1500 Pa, and at a temperature of at least 50° C. to at most 150° C. In some embodiments, a method as described herein is carried out at a pressure of at least 500 Pa to at most 10,000 Pa and at a temperature of at least 50° C. to at most 200° C. In some embodiments, a method as described herein is carried out at a pressure of at least 700 Pa and at a temperature of at least 50° C. to at most 150° C. In some embodiments, a method as described herein is carried out at a pressure of at least 900 Pa, and at a temperature of at least 50° C. to at most 75° C.

Flowable films may be temporarily obtained when a volatile precursor is polymerized by a plasma and deposited on a surface of a substrate, wherein gaseous precursors (e.g. monomers) are activated or fragmented by energy provided by plasma gas discharge so as to initiate polymerization, and when the resultant material is deposited on the surface of the substrate, the material shows temporarily flowable behavior. In accordance with exemplary embodiments, when the deposition step is complete, the flowable film is no longer flowable but is solidified, and thus, a separate solidification process is not required. In other embodiments, the flowable film is densified and/or solidified after deposition. Densifying and/or solidifying the flowable film can be done by means of a curing step (also called "cure").

Accordingly, in some embodiments, the method includes a step of curing the gap filling fluid. This step increases the thermal resistance of the gap filling fluid. In other words, it increases the resistance of the gap filling fluid against deformation and/or mass loss at elevated temperatures. Additionally or alternatively, the curing step may cause the gap filling fluid to solidify.

In some embodiments, a curing step comprises generating a plasma in the reaction chamber, thus exposing the substrate to a direct plasma. Suitable direct plasmas comprise noble gas plasmas. When a direct plasma is used, a thin layer of gap filling fluid may be efficiently cured, yielding a thin high-quality layer. In some embodiments, especially when a thicker layer of cured gap filling fluid is desired, the method for filling a gap may comprise a plurality of cycles in which gap filling fluid deposition steps and curing steps employing a direct plasma treatment are alternated. In such embodiments, the process of filling a gap preferably comprises a plurality of cycles and gap filling fluid deposition and plasma treatment steps, also called pulses, are alternated. Such a cyclic process has the advantage that a larger portion of the gap filling fluid is cured: a direct plasma can have a penetration depth of around 2 to 7 nm, such that a post deposition direct plasma treatment would only cure a top layer of the gap filling fluid. Conversely, alternating deposition and plasma steps allows curing a larger part, or even the entirety of the gap filling fluid, even when using a curing technique that can have a low penetration depth, such as a direct plasma.

Suitable plasma treatments include a $H_2$ plasma, a He plasma, a $H_2$/He plasma, an Ar plasma, an Ar/$H_2$ plasma, and an Ar/He/$H_2$ plasma. It shall be understood that a $H_2$ plasma refers to a plasma that employs $H_2$ as a plasma gas. Also, it shall be understood that a $H_2$/He plasma refers to a plasma that employs a mixture of $H_2$ and He as a plasma gas. It shall be understood that other plasmas are defined analogously.

In some embodiments, a curing step comprises providing a remote plasma, e.g. a remote noble gas plasma, and exposing the substrate to one or more excited species such as at least one of radicals, ions, and UV radiation. In some embodiments, the step of curing comprises the use of an indirect plasma after the gap has been filled with the gap filling fluid. An indirect plasma can have a larger penetration depth than a direct plasma, thereby obviating the need for cyclic deposition and curing steps. Thus, an indirect plasma cure may be applied post deposition.

In some embodiments, the step of curing comprises providing a remote plasma source, and positioning one or more mesh plates between the remote plasma source and the substrate. Thus, the substrate can be exposed to radicals generated by the remote plasma source. The radicals have a penetration depth which is significantly higher than the penetration length offered by direct plasmas, e.g. significantly higher than the size of the gaps to be filled by means of the presently provided methods. Consequently, a remote plasma treatment may be advantageously applied once after all the gap filling fluid has been deposited. This notwithstanding, a remote plasma cure may also be applied cyclically with alternating plasma cure and gap filling fluid deposition steps, similar to the operation with a direct plasma. The large penetration depths of remote plasmas have the advantage that they allow efficient curing of gap filling fluid. In some embodiments, the plasma gas employed in a remote plasma comprises a noble gas, for example a noble gas selected from the list consisting of He and Ar.

In some embodiments, a method as described herein comprises one or more deposition-cure cycles. A deposition-cure cycle comprises a gap fill forming step and a curing step. The gap fill forming step comprises introducing the reaction gas in the reaction chamber and generating the plasma in the reaction chamber.

In some embodiments, the gap filling fluid is cured after it has been deposited. Optionally, the gap filling fluid is subjected to an anneal after the gap filling fluid has been deposited and before the curing step. Suitable annealing times include from at least 10.0 seconds to at most 10.0 minutes, for example from at least 20.0 seconds to at most 5.0 minutes, for example from at least 40.0 seconds to at most 2.5 minutes. Suitably, the anneal is performed in a gas mixture comprising one or more gasses selected from the list consisting of N2, He, Ar, and $H_2$. In some embodiments, the anneal is carried out at a temperature of at least 200° C., or at a temperature of at least 250° C., or at a temperature of at least 300° C., or at a temperature of at least 350° C., or at a temperature of at least 400° C., or at a temperature of at least 450° C.

A step of curing may reduce the hydrogen concentration of the gap filling fluids with respect to their uncured state. For example, the hydrogen concentration is reduced by at least 0.01 atomic percent to at most 0.1 atomic percent, or by at least 0.1 atomic percent to at most 0.2 atomic percent, or by at least 0.2 atomic percent to at most 0.5 atomic percent, or by at least 0.5 atomic percent to at most 1.0 atomic percent, or by at least 1.0 atomic percent to at most 2.0 atomic percent, or by at least 2.0 atomic percent to at most 5.0 atomic percent, or by at least 5.0 atomic percent to at most 10.0 atomic percent.

In some embodiments, the step of curing comprises exposing the gap filling fluid to a micro pulsed plasma. The application of a micro-pulsed plasma can be particularly advantageous when the as-deposited gap filling fluid comprises hydrogen. A micro pulsed plasma is a plasma treatment that comprises the application of a plurality of rapidly succeeding on-off micro pulses. The micro pulsed plasma may, for example, employ a noble gas as a plasma gas. When a 300 mm wafer is used as a substrate, a plasma gas flow rate of, for example, at least 5.0 slm, or of at least 5.0 slm to at most 7.0 slm, or of at least 7.0 slm to at most 10.0 slm is maintained during the micro pulsed plasma. For example, the on micro pulses in a micro pulsed plasma may last from at least 1.0 μs to at most 1.0 s, or from at least 2.0 μs to at most 0.50 s, or from at least 5.0 μs to at most 250 ms, or from at least 10.0 μs to at most 100.0 ms, or from at least 25.0 μs to at most 50.0 ms, or from at least 50.0 μs to at most 25.0 ms, or from at least 100.0 μs to at most 10.0 ms, or from at least 250.0 μs to at most 5.0 ms, or from at least 0.50 ms to at most 2.5 ms. For example, the off micro pulses in a micro pulsed plasma may last from at least 1.0 μs to at most 2.0 s, or from at least 2.0 μs to at most 1.0 s, or from at least 5.0 μs to at most 500 ms, or from at least 10.0 is to at most 250.0 ms, or from at least 25.0 is to at most 100.0 ms, or from at least 50.0 μs to at most 50.0 ms, or from at least 100.0 μs to at most 25.0 ms, or from at least 200.0 is to at most 10.0 ms, or from at least 500.0 is to at most 5.0 ms, or from at least 1.0 ms to at most 2.0 ms. A micro pulsed plasma may be used cyclically, i.e. as a plasma pulse in a cyclical deposition treatment, and/or as a post-deposition treatment. In other words, a process of filling a gap may comprise alternating cycles of gap filling fluid deposition and micro pulsed plasma. Additionally or alternatively, the substrate may be subjected to a micro pulsed plasma post-deposition treatment after all gap filling fluid has been deposited.

In some embodiments, the step of curing involves the use of ultraviolet (UV) light. In other words, the step of curing may involve exposing the substrate, including the gap filling fluid, to UV radiation. Such a curing step employing UV light may be called a UV cure.

In some embodiments, a UV cure is used as a post-deposition treatment. In other words, in some embodiments, the present methods can comprise depositing a gap filling fluid, and after all gap filling fluid has been deposited, subjecting the gap filling fluid to a UV cure.

In some embodiments, the present methods comprise a cyclic process comprising a plurality of cycles, the cycles each comprising a gap filling fluid deposition step and a UV curing step. The UV curing step may be separated by a purge step. Additionally or alternatively, subsequent cycles may be separated by a purge step. Suitable purge steps are described elsewhere herein.

In an exemplary embodiment, an exemplary curing step is discussed. The curing step may employ a continuous direct plasma for 20 seconds. Gap filling fluid deposition steps and direct plasma curing steps may be carried out cyclically, i.e. gap filling fluid deposition steps and curing steps may be executed alternatingly. This allows efficiently curing all, or at least a large portion, of the gap filling fluid. For curing gap filling fluid in gaps on a 300 mm substrate, each direct plasma curing step can feature, for example, 20 seconds of He plasma at an RF power of 200 W and a working pressure of 600 Pa. The reactor volume is ca. 1 liter and the He flow rate is 2 slm. It shall be understood that all flow rates and flow rate ratios as mentioned herein refer to volumetric flow rates and flow rate ratios under standard conditions.

As a further exemplary embodiment, another exemplary curing step is discussed. The curing step may involve exposing the gap filling fluid to a micro pulsed plasma. In the present example, the curing step may be carried out cyclically, i.e. alternating cycles of gap filling fluid deposition and micro pulsed RF plasma are employed, though a post-deposition micro pulsed plasma curing treatment is possible as well. The application of cyclic gap filling fluid deposition and plasma steps allows efficiently curing all, or at least a large portion, of the gap filling fluid. For curing gap filling fluid in gaps on a 300 mm substrate, each direct curing step may feature 200 micropulses comprising 0.1 seconds of plasma on time and 0.5 seconds of plasma off time. The curing step may employ a He plasma at 400 Pa. The RF power provided may be 200 W. A He flow of 10 slm may be employed.

In some embodiments, the method is executed in a system comprising two electrodes between which the substrate is positioned. The electrodes are positioned parallel at a predetermined distance called an electrode gap. In some embodiments, the electrode gap is at least 5 mm to at most 30 mm, at least 5 mm to at most 10 mm, or at least 10 mm to at most 20 mm, or of at least 20 mm to at most 30 mm.

In some embodiments, the methods as described herein are executed using a system comprising two or more precursor sources including a first precursor source, a second precursor source, optionally a third precursor source, and optionally more precursor sources, which are in fluid connection with a mixing chamber as described herein. A precursor source can suitably comprise a precursor recipient, e.g. a precursor canister, a precursor bottle, or the like; and one or more gas lines operationally connecting the precursor recipient to the mixing chamber, and one or more gas lines further connecting the mixing chamber to the reaction chamber. In particular, the first precursor source can comprise a first precursor recipient comprising a first precursor, the second precursor source can comprise a second precursor recipient comprising a second precursor, and so on. In such embodiments, a precursor recipient may be suitably maintained at a temperature which is from at least 5° C. to at most 50° C. lower than the temperature of the reaction chamber, or at a temperature which is from at least 5° C. to at most 10° C. lower than the temperature of the reaction chamber, or at a temperature which is from at least 10° C. to at most 20° C. lower than the temperature of the reaction chamber, or at a temperature which is from at least 30° C. to at most 40° C. lower than the temperature of the reaction chamber, or at a temperature which is from at least 40° C. to at most 50° C. lower than the temperature of the reaction chamber. The mixing chamber and the gas lines may be suitably maintained at a temperature between the temperature of the precursor recipients and the reaction chamber. For example, the gas lines may be maintained at a temperature which is from at least 5° C. to at most 50° C., or from at least 5° C. to at most 10° C., or from at least 10° C. to at most 20° C., or from at least 30° C. to at most 40° C., or from at least 40° C. to at most 50° C. lower than the temperature of the reaction chamber. In some embodiments, at least a part of the gas lines, the mixing chamber, and the reaction chamber are maintained at a substantially identical temperature which is higher than the temperature of the precursor recipient.

In some embodiments, the substrate is subjected to a micro pulsed plasma while a plasma gas is provided to the reaction chamber at a flow rate that is higher than a predetermined threshold. The combination of a micro pulsed plasma with these high flow rates minimizes redeposition of volatile by products released during plasma-induced cross linking of the deposited gap filling fluid. In some embodiments, the flow rate of the plasma gas during micro pulsed plasma treatment is at least 5.0 slm (standard liter per minute), preferably at least 10.0 slm. The skilled artisan understands that this flow rate depends on reaction chamber volume and substrate size, and the values provided here for 300 mm wafers and a reaction chamber volume of 1 liter can be readily transferred to other substrate sizes and/or reactor volumes. In some embodiments, a noble gas is used as a plasma gas during micro pulsed plasma treatment. In some embodiments, the noble gas is selected from He and Ar.

A method as described herein can be executed in any suitable system. For example, it can be executed in a system as described herein. Such systems can be suitably used for performing a method of filling a gap as described herein.

Some systems employ precursor modules that are constructed and arranged for mixing precursors in the gas phase. Particularly described herein is a system that comprises a precursor module. The precursor module comprises a first precursor vessel, a second precursor vessel, and a mixing chamber. The first precursor vessel comprises a first precursor. The second precursor vessel comprises a second precursor. The first and second precursors are different. The system further comprises a first fluid connection between the first precursor vessel and the mixing chamber and a second fluid connection between the second precursor vessel and the mixing chamber. The system further comprises a reaction chamber, a precursor mixture line, and a controller. It shall be understood that the mixing chamber and the reaction chamber are different. In some embodiments, the first precursor vessel comprises a first precursor heating element constructed and arranged for maintaining the first precursor in the first precursor vessel at a first precursor temperature. In some embodiments, the second precursor vessel comprises a second precursor heating element constructed and arranged for maintaining the second precursor in the first precursor vessel at a second precursor temperature. Suitable heating elements include resistive heaters, infrared heaters, convective heaters, liquid-based heaters, and Peltier heaters.

In some embodiments, the first precursor vessel comprises a first precursor cooling element constructed and arranged for maintaining the first precursor in the first precursor vessel at a first precursor temperature. In some embodiments, the second precursor vessel comprises a second precursor cooling element constructed and arranged for maintaining the second precursor in the second precursor vessel at a second precursor temperature. Suitable precursor cooling elements include convective coolers and Peltier coolers. Cooling elements can be particularly useful for lowering the vapor pressure of high-vapor pressure precursors.

In some embodiments, the first precursor vessel comprises a first precursor cooling element and a first precursor heating element. In some embodiments, the second precursor vessel comprises a second precursor cooling element and a second precursor heating element.

The first precursor temperature and the second precursor temperature are different. The controller is constructed and arranged for maintaining the first precursor vessel at a first precursor temperature by means of the first precursor heating element. The precursor mixture line is constructed and arranged for providing a precursor mixture from the mixing chamber to the reaction chamber. Suitable liquid and gas lines include stainless steel tubes. In some embodiments, the controller is configured for causing the system to execute a method for filling a gap as described herein. By controlling the first precursor temperature and the second precursor temperature, the amount of first precursor and second precursor that is provided to the mixing chamber can be effectively controlled.

In some embodiments, the mixing chamber comprises two or more mixing compartments including a first mixing compartment and a second mixing compartment. The first mixing compartment is in connection with the first precursor source via the first fluid connection. The second mixing compartment is in fluid connection with the second mixing compartment via the second fluid connection. In such embodiments, a method as described herein can comprise providing the first precursor to the first mixing compartment, providing the second precursor to the second mixing compartment, and subsequently opening a compartment valve between the first mixing compartment and the second mixing compartment. Accordingly, any risk of back flow of one precursor in another precursor vessel can be efficiently avoided.

Suitably, the first precursor vessel can further comprise a first temperature sensor, and the second precursor vessel can further comprise a second temperature sensor. In such embodiments, the controller can be further configured for receiving a first temperature signal from the first temperature sensor and a second temperature signal from the second temperature sensor. The controller can then be configured for controlling the amount of heat generated by the first and second heating elements based on the first and second temperature signals, respectively. Accordingly, the temperature in the first and second precursor vessels can be efficiently and accurately controlled.

Some systems employ precursor modules that are constructed and arranged for mixing precursors in the vapor phase. Such systems can be suitably used for performing a method of filling a gap as described herein.

Particularly described herein is a system that comprises a precursor module. The precursor module comprises a first precursor vessel, a second precursor vessel, and a mixing chamber. The first precursor vessel comprises a first precursor. The second precursor vessel comprises a second precursor. The first and second precursors are different. The system further comprises a first fluid connection between the first precursor vessel and the mixing chamber and a second fluid connection between the second precursor vessel and the mixing chamber. The first fluid connection is provided with a first liquid flow regulator. The first fluid connection suitably allows regulating, by a controller, the flow rate of the first precursor to the mixing chamber. The second fluid connection is provided with a second liquid flow regulator. The second fluid connection suitably allows regulating, by a controller, the flow rate of the second precursor to the mixing chamber. The system further comprises a reaction chamber, a precursor mixture line, and a controller. It shall be understood that the mixing chamber and the reaction chamber are different. The precursor mixture line is provided between the mixing chamber and the reaction chamber. The controller is constructed and arranged for causing the first liquid flow regulator to provide a pre-determined first flow rate of first precursor to the mixing chamber. The controller is further constructed and arranged for causing the second liquid flow regulator to provide a pre-determined second flow rate of second precursor to the mixing chamber. The precursor mixture line is constructed and arranged for providing a precursor mixture from the mixing chamber to the reaction chamber. In some embodiments, the controller is configured for causing the system to execute a method for filling a gap as described herein.

In some embodiments, a system as described herein comprises a first precursor vessel that is constructed and arranged for providing a first precursor in a gaseous state to the mixing chamber, and a second precursor vessel that is constructed and arranged for providing a second precursor in a liquid state to the mixing chamber. Thus, hybrid forms of the presently described systems can be employed as well, in some embodiments.

Thus, further described herein is a system that comprises a precursor module. The precursor module comprises a first precursor vessel, a second precursor vessel, and a mixing chamber. The first precursor vessel comprises a first precursor. The second precursor vessel comprises a second precursor. The first and second precursors are different. The system further comprises a first fluid connection between the first precursor vessel and the mixing chamber and a second fluid connection between the second precursor vessel and the mixing chamber. The system further comprises a reaction chamber, a precursor mixture line, and a controller. It shall be understood that the mixing chamber and the reaction chamber are different. The first precursor vessel comprises a first precursor heating element constructed and arranged for maintaining the first precursor in the first precursor vessel at a first precursor temperature. The second fluid connection is provided with a second liquid flow regulator. The second fluid connection suitably allows regulating, by a controller, the flow rate of the second precursor to the mixing chamber. The controller is constructed and arranged for maintaining the first precursor vessel at a first precursor temperature by means of the first precursor heating element. The controller is further constructed and arranged for providing the second precursor to the mixing chamber in liquid form at a predetermined flow rate. The precursor mixture line is constructed and arranged for providing a precursor mixture from the mixing chamber to the reaction chamber. In some embodiments, the controller is configured for causing the system to execute a method for filling a gap as described herein.

It can be desirable to dilute the precursor mixture. Thus, in some embodiments, a system as described herein can further comprise a carrier gas source. The carrier gas source is in fluid connection with the mixing chamber. The carrier gas source is provided with a carrier gas mass flow controller. Suitably, the carrier gas mass flow controller can be operationally connected with the controller such that the carrier gas flow to the mixing chamber can be controlled by the controller.

Various mixing chambers can be used in the systems as described herein. For example, a mixing chamber can comprise a mixing chamber wall that comprises a spiral pattern. The mixing chamber can be elongate. The wall having a spiral pattern can be an elongate wall. The mixing chamber can be smaller than the reaction chamber, for example at least 10 times smaller. In some embodiments, the mixing chamber is constructed and arranged for generating turbulent flow in the mixing chamber, which can be done, for example, by providing a spiral pattern on the walls of the mixing chamber.

The flow rate of one or more of the first precursor, the second precursor, and the carrier gas into the mixing chamber can be controlled by means of any suitable means such as precursor flow control valves. Suitable precursor flow control valves include precursor flow control valves, diaphragm valves, and pneumatic valves. For example, the mixing chamber can comprise one or more a piezoelectric control valves. The controller is constructed and arranged for actuating the one or more precursor flow control valves, e.g. piezoelectric control valves, to regulate at least one of carrier gas flow, first precursor flow, and second precursor flow into the mixing chamber. In some embodiments, the mixing chamber comprises a first precursor flow control valve and a second precursor flow control valve. The first precursor flow control valve is constructed and arranged for regulating the first precursor flow. The second precursor flow control valve is constructed and arranged for regulating the second precursor flow.

The precursor mixture can be provided into the reaction chamber by means of any suitable injector. For example, the reaction chamber can comprise a showerhead injector. The showerhead injector is positioned parallel to a substrate support. The showerhead injector is further operationally connected to the precursor mixture line. The showerhead injector is further constructed and arranged for providing the precursor mixture to the reaction chamber.

The system can be further provided with an RF source. RF sources can be suitably employed for generating a plasma. Thus, in some embodiments, a system as described herein comprises an RF power source. The RF power source is electrically connected to one of the showerhead injector and the substrate support. The RF power source is constructed and arranged for generating a plasma between the showerhead injector and the substrate support. Thus, a direct plasma can be generated in the reaction chamber.

When an indirect or remote plasma configuration is desirable, the system can suitably comprise a plasma generating unit. The plasma generating unit is positioned outside of the reaction chamber. In particular, when the plasma generating unit is positioned adjacent to the reaction chamber, an indirect plasma configuration is obtained. When the plasma generating unit is positioned remotely from the reaction chamber, a remote plasma configuration is obtained.

In an exemplary embodiment, reference is made to FIG. 1 which shows an embodiment of a precursor module (100) as described herein. The precursor module (100) is constructed and arranged for mixing precursors in the gas phase. The precursor module (100) comprises a first precursor vessel (110), a second precursor vessel (120), and a mixing chamber (130). The first precursor vessel (110) comprises a first precursor. The second precursor vessel (120) comprises a second precursor. It shall be understood that the first precursor vessel and the second precursor vessel comprise the first precursor and the second precursor in the liquid phase. The first and second precursors are different. The precursor module further comprises a first fluid connection (115) between the first precursor vessel (110) and the mixing chamber (130) and a second fluid connection (125) between the second precursor vessel (120) and the mixing chamber (130). Optionally, the first fluid connection (115) is provided with a first precursor valve (116) which is constructed and arranged for regulating first precursor flow from the first precursor vessel (110) to the mixing chamber (130). Suitable precursor valves include butterfly valves, diaphragm valves, pneumatic valves, and piezoelectric control valves, amongst others. Optionally, the second fluid connection (125) is provided with a second precursor valve (126) which is constructed and arranged for regulating second precursor flow from the second precursor vessel (120) to the mixing chamber (130). The first precursor vessel (110) is further provided with a first precursor heater (111) which is constructed and arranged for heating the first precursor to a first pre-determined temperature. The second precursor vessel (120) is further provided with a second precursor heater (121) which is constructed and arranged for heating the second precursor to a second pre-determined temperature. The first pre-determined temperature and the second pre-determined temperature are different. The precursor module further comprises a precursor mixture line (135) that can be optionally provided with a precursor mixing line valve (136). The precursor mixture line (135) can be used, for example, for providing precursor mixture to a reaction chamber.

In some embodiments, the first precursor has a lower vapor pressure than the second precursor. For example, the first precursor can have a vapor pressure of at least 30 Pa to at most 300 Pa, and the second precursor can have a vapor pressure of at least 1 kPa to at most 5 kPa. In such embodiments, a precursor module (100) according to FIG. 1 can be used for mixing precursors according to the following procedure: 1. Provide precursor module with first precursor valve (116), second precursor valve (126), and precursor mixing line valve (136) in a closed position. 2. Open first precursor valve (116), thereby allowing first precursor to enter the mixing chamber (130). 3. After step 2, close the first precursor valve (116) and open the second precursor valve (126), thereby allowing second precursor to enter the mixing chamber (130). 4. After step 3, close the second precursor valve (126) and open the precursor mixing line valve (136). Suitably, the mixing chamber (130) is kept at a higher temperature than the first precursor vessel (110) and the second precursor vessel (120). Accordingly, the first precursor and the second precursor can be efficiently mixed and the resulting precursor mixture can be further provided to a suitable location such as a reaction chamber.

Figure 2:
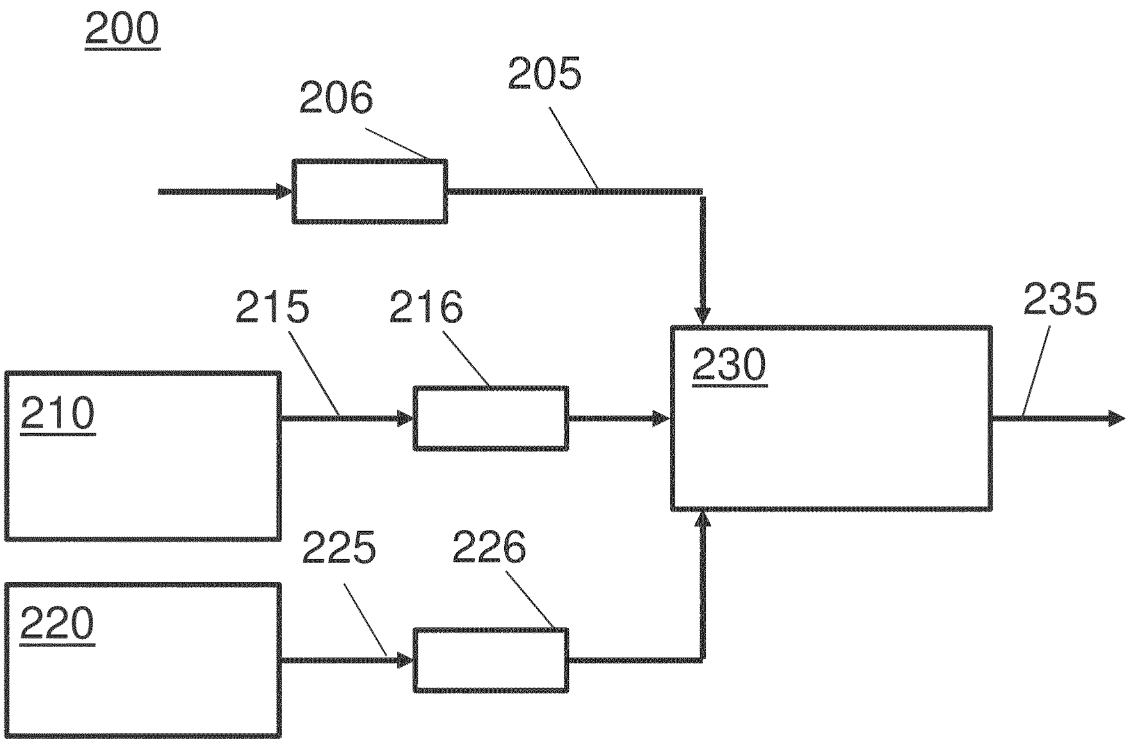
FIG. 2 shows another embodiment of a precursor module (200) as described herein.

In a further exemplary embodiment, reference is made to FIG. 2 which shows another embodiment of a precursor module (200) as described herein. The precursor module (200) is constructed and arranged for mixing precursors. The precursor module (200) comprises a first precursor vessel (210), a second precursor vessel (220), and a mixing chamber (230). The first precursor vessel (210) comprises a first precursor. The second precursor vessel (220) comprises a second precursor. It shall be understood that the first precursor vessel and the second precursor vessel comprise the first precursor and the second precursor in the liquid phase. The first and second precursors are different. The precursor module further comprises a first fluid connection (215) between the first precursor vessel (210) and the mixing chamber (230) and a second fluid connection (225) between the second precursor vessel (220) and the mixing chamber (230). The first fluid connection (215) is provided with a first mass flow controller (216) which is constructed and arranged for regulating liquid first precursor flow from the first precursor vessel (210) to the mixing chamber (230). The second fluid connection (225) is provided with a second mass flow controller (226) which is constructed and arranged for regulating liquid second precursor flow from the second precursor vessel (220) to the mixing chamber (230). The mixing chamber (230) is further in fluid connection with a precursor mixture line (235) which can be employed to provide precursor mixture to a reaction chamber.

The precursor module (200) according to FIG. 2 can optionally comprise a carrier gas line (205) which is in fluid connection with the mixing chamber (230). The carrier gas comprises a carrier gas mass flow controller (206) and is constructed and arranged for providing a carrier gas to the mixing chamber. Suitable carrier gasses include hydrogen, nitrogen, and noble gasses such as He, Ne, Ar, Kr, and Xe.

In an exemplary mode of operation of a precursor module (200) according to FIG. 2, liquid first precursor is sprayed into the mixing chamber (230) by means of a first precursor nozzle and liquid second precursor is sprayed into the mixing chamber (230) by means of a second precursor nozzle. Optionally, the carrier gas can be provided to the mixing chamber (230) through an orifice. The partial pressures and temperature in the mixing chamber (230) are kept at levels which cause the first precursor and the second precursor to evaporate. Thus, the first precursor, the second precursor, and optionally the carrier gas can be efficiently mixed.

Figure 3:
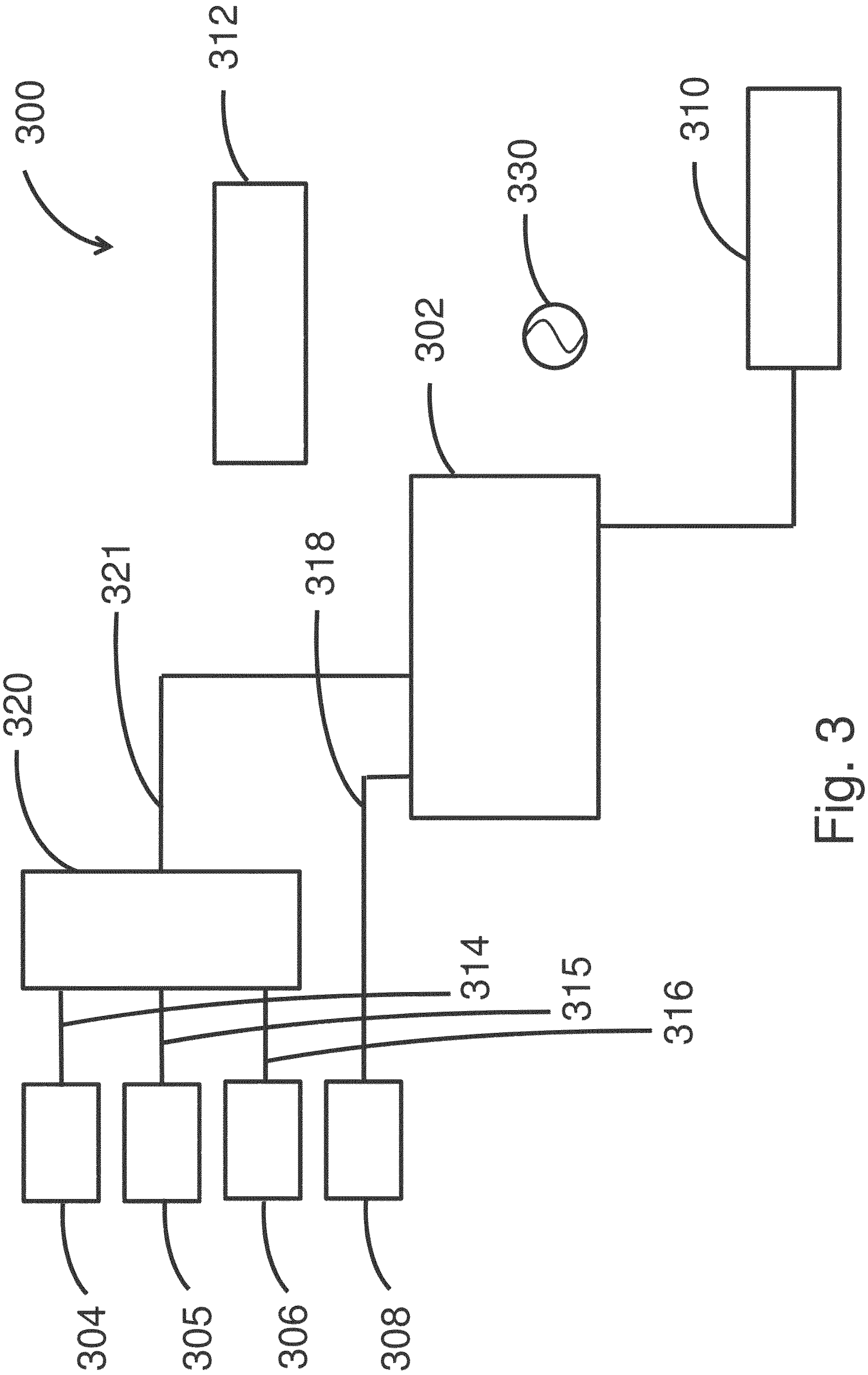
FIG. 3 illustrates a system (300) in accordance with yet additional exemplary embodiments of the disclosure.

FIG. 3 illustrates a system (300) in accordance with yet additional exemplary embodiments of the disclosure. The system (300) can be used to perform a method as described herein and/or form a structure or device portion as described herein. In the illustrated example, the system (300) includes one or more reaction chambers (302), and a number of gas sources (304)-(308), and a controller (312). The gas sources comprise a first precursor vessel (304), a second precursor vessel (305), a carrier gas source (306), an optional reactant source (308), and an exhaust (310). The reaction chamber (302) can include any suitable reaction chamber, such as a plasma-enhanced chemical vapor deposition (PE-CVD) or chemical vapor deposition (CVD) reaction chamber.

The first precursor vessel (304) comprises a first precursor. The second precursor vessel (305) comprises a second precursor. The carrier gas source (306) is in fluid connection with a source such as a vessel of a suitable carrier gas. The optional reactant source (308), if present, can comprise a reactant vessel or can be in fluid connection with a reactant vessel.

The first precursor vessel (304), the second precursor vessel (305), and the carrier gas source (306) are in fluid connection with a mixing chamber (320) via lines (314,315, 316) which can each include flow controllers, valves, heaters, and the like. The mixing chamber (320) is in fluid connection with the reaction chamber via mixing line (321). The optional reactant source (308), if present, can directly provide reactant to the reaction chamber (302) via line (318). Optionally, the system can include any suitable number of additional gas sources.

Exhaust (310) can include one or more vacuum pumps.

The system can optionally comprise a radio frequency (RF) power source (330). The RF power source (330) can be suitably employed for generating a plasma. The plasma can be generated in the reaction chamber (302), in which case a direct plasma configuration is used. Alternatively, indirect or remote plasma configurations can be used as well which, as such, are known in the art.

Controller (312) includes electronic circuitry including a processor, and software to selectively operate valves, manifolds, heaters, pumps and other components included in the system (300). Such circuitry and components operate to introduce precursors, carrier gasses, and optional reactants from the respective sources (304)-(308).

The controller (312) can control gas flow, temperature of the substrate and/or reaction chamber, pressure within the reaction chamber, and various other operations to provide proper operation of the system (300). The controller (312) can include control software to electrically or pneumatically control valves to control flow of precursors, reactants and purge gases into and out of the reaction chamber (302). Controller (312) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

It will be appreciated that there are many arrangements of valves, conduits, precursor sources, and purge gas sources that may be used to accomplish the goal of feeding gases into the reaction chamber (302). Further, as a schematic representation of a system, many components have been omitted for simplicity of illustration, and such components may include, for example, various valves, manifolds, purifiers, heaters, containers, vents, and/or bypasses.

During operation of reactor system (300), substrates, such as semiconductor wafers (not illustrated), are transferred from, e.g., a substrate handling system to reaction chamber (302). Once the substrate(s) are transferred to the reaction chamber (302), one or more gases from the gas sources (304)-(308), such as precursors, carrier gases, and optional reactants, are introduced into reaction chamber (302).

Figure 4:
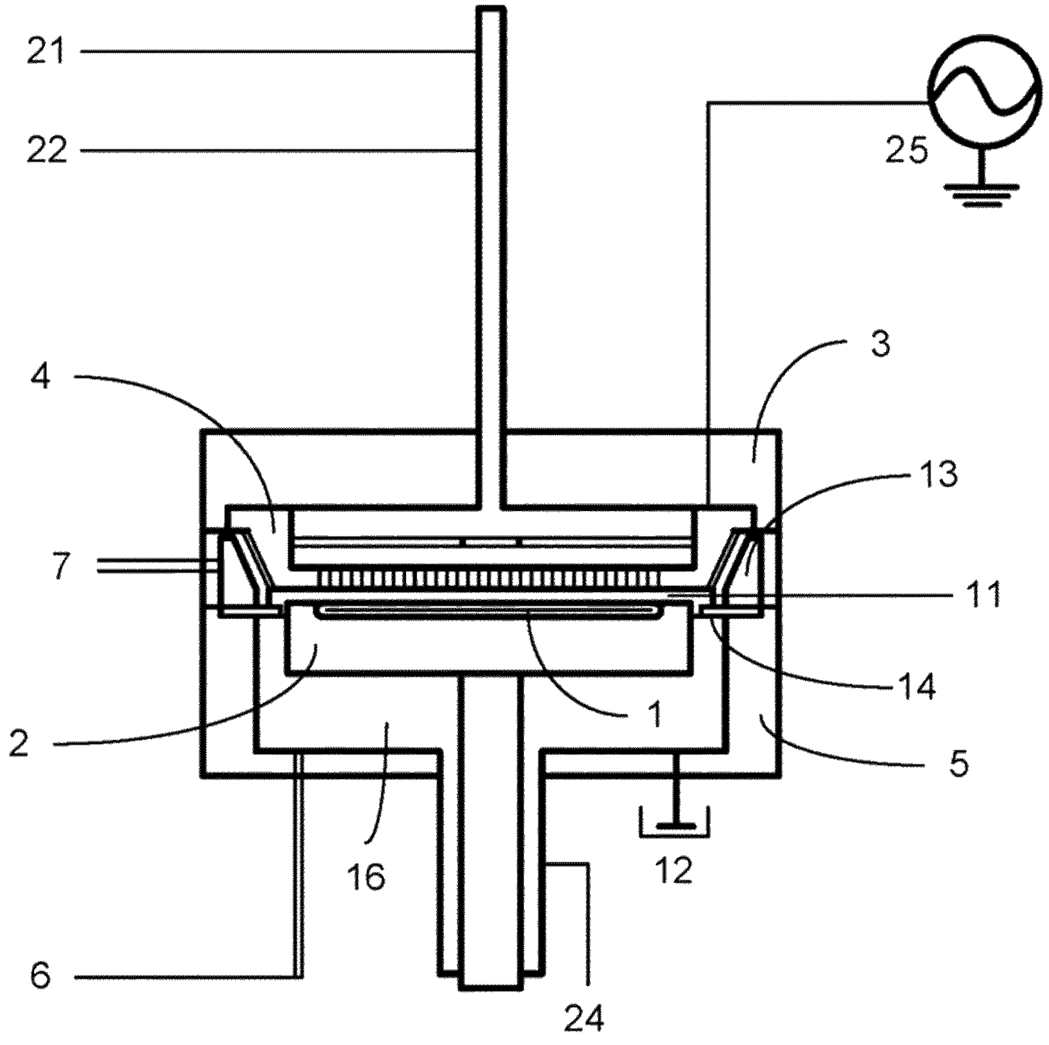
FIG. 4 shows an apparatus according to embodiments of the present disclosure.

The presently provided methods may be executed in any suitable apparatus, including in a reactor as shown in FIG. 4. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma is excited between the electrodes. A temperature regulator may be provided in a lower stage (2), i.e., the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (7) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, depositing the gap filling fluid and curing the gap filling fluid is done in the same reaction chamber. In some embodiments, forming the gap filling fluid and curing the gap filling fluid is done in separate reaction chambers comprised in the same system.

A skilled artisan will appreciate that the apparatus includes one or more controller(s) (not shown) programmed or otherwise configured to cause the deposition process described elsewhere herein to be conducted. The controller(s) communicate with the various power sources, heating systems, pumps, robotics and gas flow controllers or valves of the reactor, as will be appreciated by the skilled artisan. The controller(s) include electronic circuitry including a processor, and software to selectively operate valves, manifolds, heaters, pumps and other components included in the system. Such circuitry and components operate to introduce precursors, reactants, and optionally purge gases from the respective sources (e.g., bottle 20). The controller can control timing of gas supply sequences, temperature of the substrate and/or reaction chamber (3), pressure within the reaction chamber (3), and various other operations to provide proper operation of the system. The controller(s) can include control software to electrically or pneumatically control valves to control flow of precursors, reactants and purge gases into and out of the reaction chamber (3). Controller(s) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

Optionally, a dual chamber reactor can be used. A dual chamber reactor comprises two sections or compartments for processing wafers disposed close to each other. In such a dual chamber reactor, a reactant gas and a noble gas can be supplied through a shared line and precursor-containing gases are provided by means of unshared lines. In exemplary embodiments, forming a gap filling fluid occurs in one of the two compartments, and the step of curing occurs in another reaction chamber. This can advantageously improve throughput, e.g. when gap filling fluid formation and curing occur at different temperatures, then gap filling fluid formation can be done in one reaction chamber and curing can be done in an adjacent reaction chamber.

Figure 5:
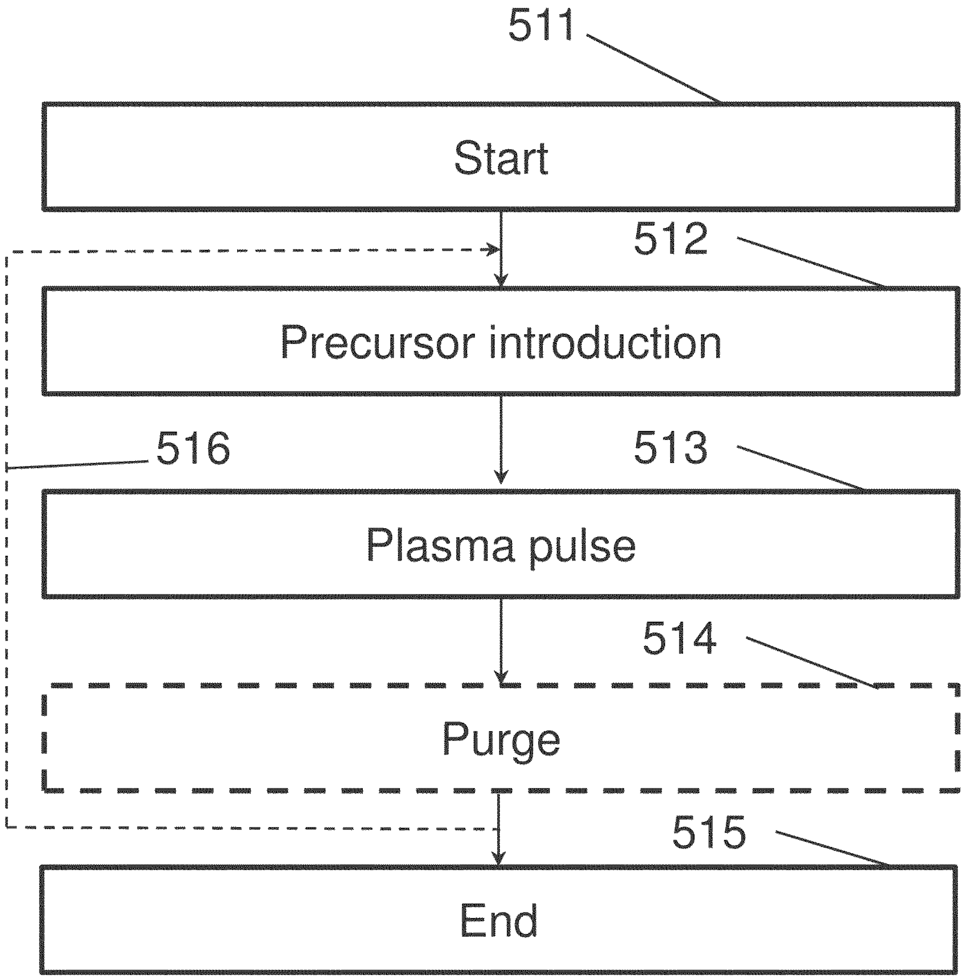
FIG. 5 shows a schematic representation of an embodiment of a method for filling a gap.

FIG. 5 shows a schematic representation of an embodiment a method for filling a gap. The method starts (511) after providing a substrate to a reaction chamber, and comprises a precursor introduction step (512) in which a first precursor and a second precursor are introduced to the reaction chamber after they have been mixed using a mixing chamber in accordance with an embodiment of the present disclosure. The method then comprises a plasma pulse (513) in which the substrate is subjected to a plasma treatment. During the plasma treatment, the first precursor and the second precursor react to form a gap filling fluid. Optionally, the reaction chamber is then purged in an inter-cycle purge (514). It shall be understood that no plasma is generated in the reaction chamber during the purges (514). Optionally, the precursor introduction step (512) and the plasma pulse (513) are repeated (516) one or more times.

Figure 6:
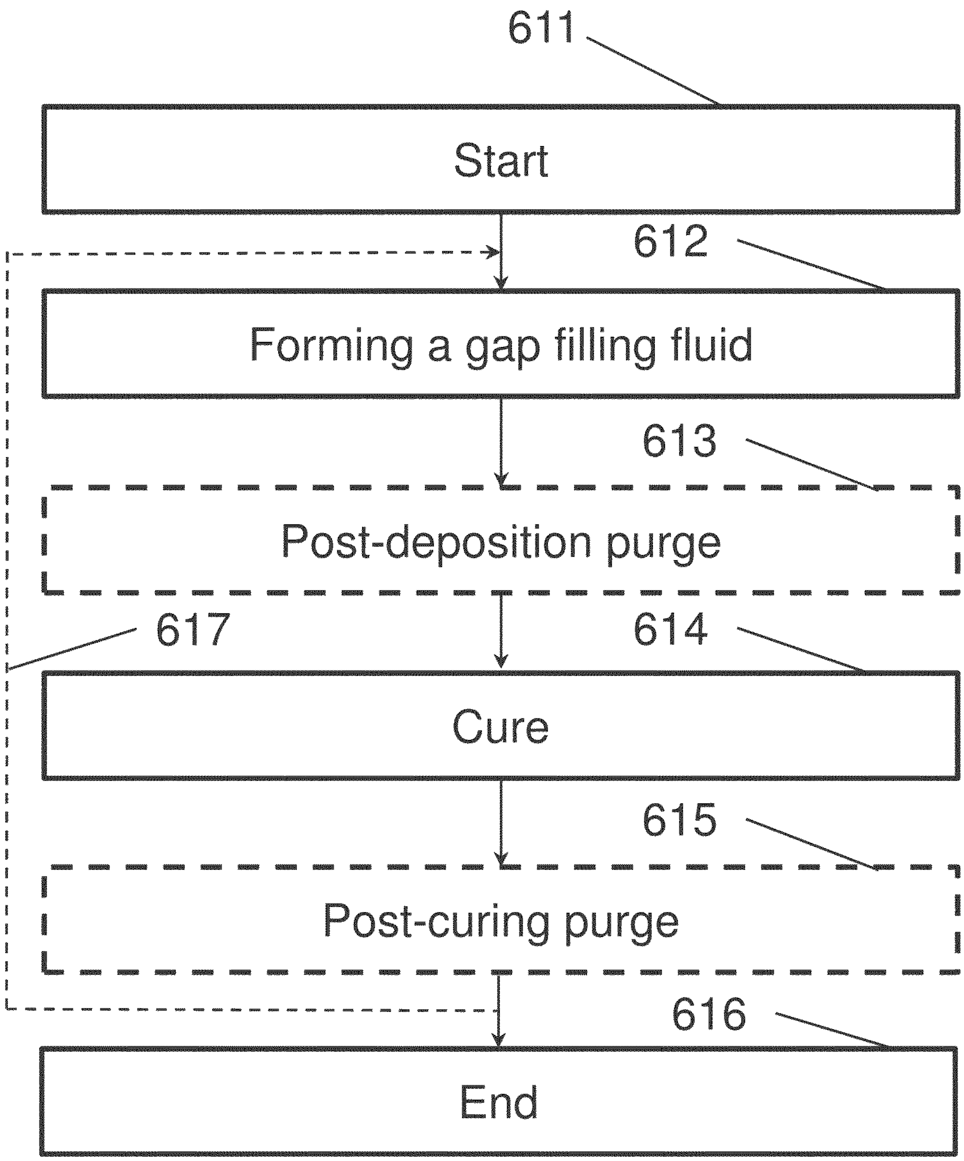
FIG. 6 shows a schematic representation of an embodiment of a method as disclosed herein.

FIG. 6 shows a schematic representation of an embodiment of a method as disclosed herein. The method starts (611) after providing a substrate to a reaction chamber. The method comprises a step (612) of forming a gap filling fluid on the substrate. The step of forming the gap filling fluid on the substrate comprises providing a precursor mixture to the reaction chamber by means of a method as described herein. Optionally, the reaction chamber is then purged by means of a post-deposition purge (613). The method then comprises a step (614) of curing the gap filling fluid. Optionally, the reaction chamber is then purged by means of a post-cure purge (615). The step (614) of curing the gap filling fluid can be performed in the same reaction chamber as the step (612) of forming a gap filling fluid on the substrate. Alternatively, the step (614) of curing the gap filling fluid can be performed in a different reaction chamber comprised in the same vacuum system as the step (612) of forming a gap filling fluid on the substrate. It shall be understood that the step (612) of forming a gap filling fluid on the substrate and the step (614) of curing the gap filling fluid are executed without any intervening vacuum break. Optionally, the steps from the step (612) of depositing a gap filling fluid on the substrate to the step (614) of curing the gap filling fluid are repeated (617) one or more times. Optionally, subsequent cycles are separated by the post-cure purge (615). The resulting deposition-cure cycles can be repeated until a desired thickness of cured gap filling fluid has been deposited on the substrate.

Thus, a material is formed in the gap. Advantageously, the composition of the material can be controlled by controlling the relative amounts of first precursor and second precursor that are introduced into the reaction chamber. When a desired amount of material is formed in the gap, the method ends (615).

Figure 7:
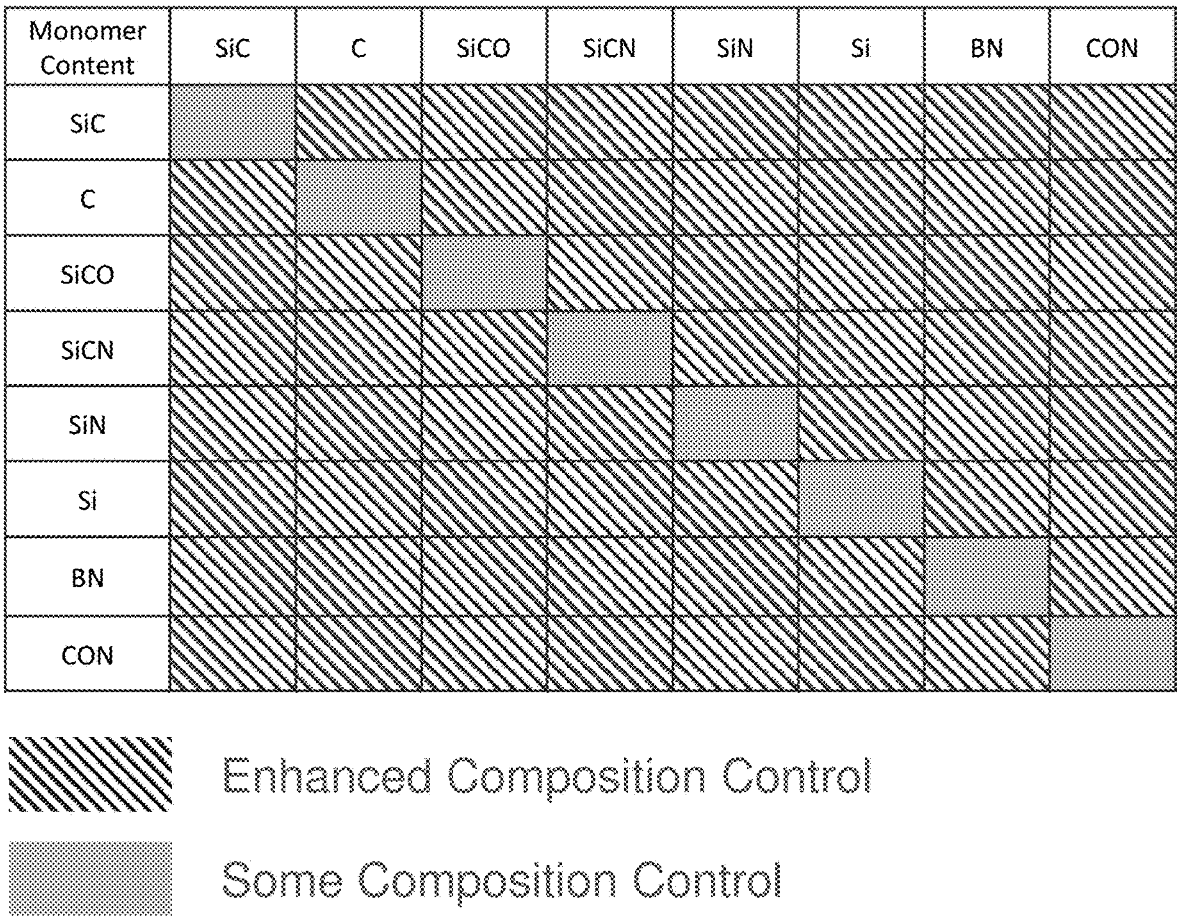
FIG. 7 shows how using different first precursors and second precursors allows enhanced composition control of gap filling fluids as opposed to processes that employ only a single precursor.

FIG. 7 shows how using different first precursors and second precursors allows enhanced composition control of gap filling fluids as opposed to processes that employ only a single precursor.

Indeed, when the first and second precursors contain different elements, then the gap filling fluid can have a composition that includes more elements than any one of the first and second precursor. For example, when the first precursor consists of B, N, and H; and the second precursor consists of Si, C, and H, then a gap filling fluid consisting of B, N, Si, C, and H can be formed, even though neither the first precursor nor the second precursor contains all of B, N, Si, C, and H.

When the first and second precursors contain the same elements, but in different amounts, then compositional control of the gap filling fluid is possible as well. For example, when the first precursor contains Si and a relatively low amount of C, and the second precursor contains Si and a relatively high amount of C, then the relative Si and C composition of the gap filling fluid can be controlled by controlling the relative amounts of the first and second precursor that are introduced into the reaction chamber: the more of the first precursor introduced into the reaction chamber vis-à-vis the second precursor, the higher the Si content and the lower the C content of the resulting gap filling fluid.

Figure 8A:
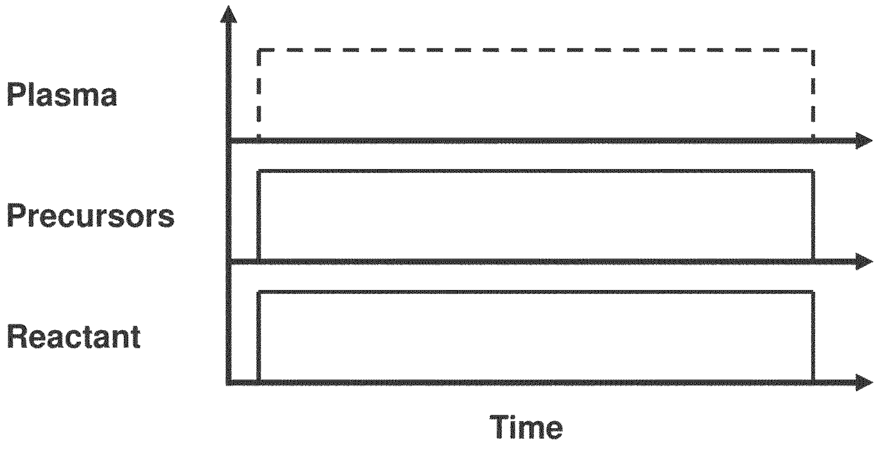
FIGS. 8A-8C show pulsing schemes that can be employed in methods according to embodiments of the present disclosure.
Figure 8B:
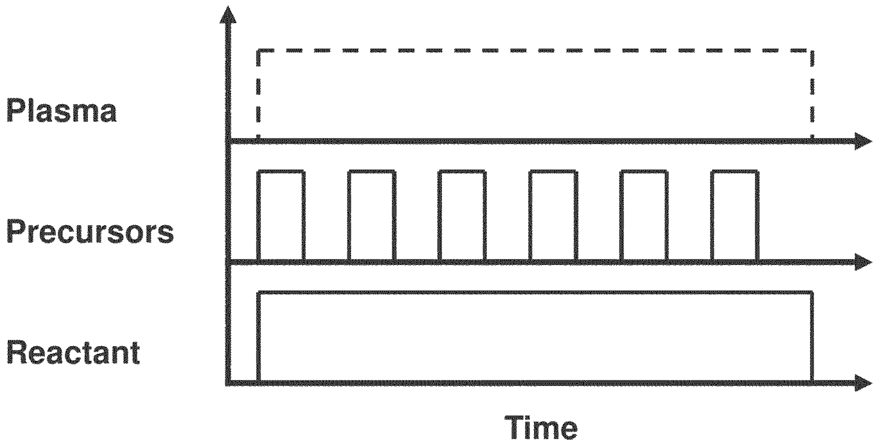
Figure 8C:
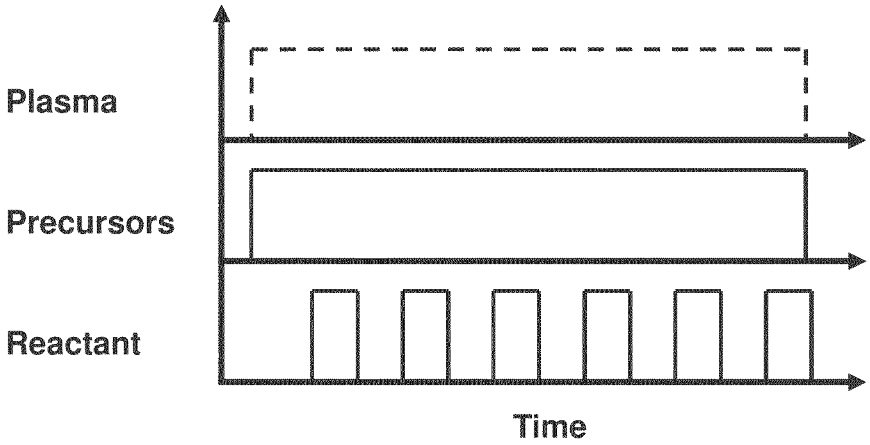

Plasma generation and precursor introduction can be done using any one of a number of pulsing schemes, such as the pulsing schemes shown in FIGS. 8A-8C.

FIG. 8A shows that, in some embodiments, a plasma can be continually generated in the reaction chamber while the precursor mixture is continually provided to the reaction chamber, and the reactant is also continuously provided to the reaction chamber. FIG. 8B shows that, in some embodiments, a plasma is continually generated in the reaction chamber while the precursor mixture is provided to the reaction chamber in a plurality of discrete pulses, and the reactant is continuously provided to the reaction chamber. FIG. 8C shows that, in some embodiments, a plasma is continually generated in the reaction chamber while the precursor mixture is provided to the reaction chamber in discrete pulses, and the reactant is also provided to the reaction chamber in discrete pulses.

Although certain embodiments and examples have been discussed, it will be understood by those skilled in the art that the scope of the claims extend beyond the specifically disclosed embodiments to other alternative embodiments and/or uses and obvious modifications and equivalents thereof. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method of providing a first precursor and a second precursor to a reaction chamber, the method comprising:

providing a precursor module comprising a first precursor vessel comprising a first precursor, a second precursor vessel comprising a second precursor, and a mixing chamber comprising a mixing valve on an exhaust port of the mixing chamber;

maintaining the first precursor in the first precursor vessel at a first precursor temperature;

maintaining the second precursor in the second precursor vessel at a second precursor temperature;

providing a first fluid connection between the first precursor vessel and the mixing chamber;

providing a second fluid connection between the second precursor vessel and the mixing chamber;

providing a third fluid connection between the mixing chamber and the reaction chamber that is separate from the mixing chamber;

controlling, by a controller, the first precursor temperature and the second precursor temperature, wherein the first precursor and the second precursor are provided separately to the mixing chamber, and wherein providing the first precursor and the second precursor separately to the mixing chamber comprises:

first providing a first pre-determined quantity of the first precursor to the mixing chamber; and after providing the first pre-determined quantity of the first precursor, providing a second pre-determined quantity of the second precursor to the mixing chamber;

forming a precursor mixture, in the mixing chamber, by mixing the first pre-determined quantity of the first precursor and the second pre-determined quantity of the second precursor; and opening the mixing valve on the exhaust port of the mixing chamber;

providing, based on the opening, the precursor mixture to the reaction chamber.

2. The method according to claim 1, wherein the first precursor has a first vapor pressure;

wherein the second precursor has a second vapor pressure; and wherein the second vapor pressure is higher than the first vapor pressure.

3. The method according to claim 1, wherein a first mass controller is provided between the first precursor vessel and the mixing chamber, the first mass controller being constructed and arranged to regulate the first pre-determined quantity of the first precursor that is provided to the mixing chamber.

4. The method according to claim 1, wherein a second mass controller is provided between the second precursor vessel and the mixing chamber, the second mass controller being constructed and arranged to regulate the second pre-determined quantity of the second precursor that is provided to the mixing chamber.

5. The method according to claim 1, further comprising a step of providing a carrier gas to the mixing chamber.

6. The method according to claim 1, wherein the precursor mixture is continuously provided to the reaction chamber.

7. A method of providing a precursor mixture to a reaction chamber, the method comprising executing one or more mixing cycles, a mixing cycle comprising:

mixing a first precursor and a second precursor in accordance with the method of claim 1, thereby forming a precursor mixture in a mixing chamber that is separated from the reaction chamber; and opening a mixing valve on an exhaust port of the mixing chamber, the mixing valve being provided downstream of the mixing chamber and upstream of the reaction chamber, thereby providing the precursor mixture from the mixing chamber to the reaction chamber.

8. The method according to claim 7, wherein the mixing valve is provided on an exhaust port of the mixing chamber.

9. The method according to claim 7, wherein the mixing valve is provided on a precursor mixture line; and wherein the precursor mixture line is constructed and arranged to provide the precursor mixture to the reaction chamber when the mixing valve is in an open position.

10. A method of filling a gap comprising:

introducing a substrate in a reaction chamber, the substrate being provided with a gap;

introducing a precursor mixture to the reaction chamber by the method according to claim 1; and generating a plasma in the reaction chamber, thereby forming a gap filling fluid that at least partially fills the gap, wherein the precursor mixture comprises a first precursor and a second precursor; and wherein the first precursor and the second precursor are different and each has a molar mass of at least 50 g/mol.

11. A method of filling a gap comprising:

introducing a substrate in a reaction chamber, the substrate being provided with a gap;

introducing a precursor mixture to the reaction chamber by the method according to claim 1; and generating a plasma in the reaction chamber, thereby forming a gap filling fluid that at least partially fills the gap, wherein the precursor mixture comprises a first precursor and a second precursor; and wherein the first precursor and the second precursor are different and each comprises at least one of an alkali metal, an alkaline earth metal, a halogen, boron (B), aluminum (Al), carbon (C), and silicon (Si).

12. The method according to claim 11, wherein the first precursor comprises a first element, wherein the second precursor comprises a second element;

wherein the first element and the second element are different; and wherein the first element and the second element are incorporated in the gap filling fluid.

13. The method according to claim 1, wherein at least one of the first precursor and the second precursor is selected from a list consisting of hydrocarbons, amines, amides, imides, silanes, alkylsilanes, siloxanes, and borazanes.

14. The method according to claim 1, wherein at least one of the first precursor and the second precursor comprises:

C;

Si;

Si and C;

Si, C, and O;

Si, C, and N;

Si and N;

Si;

B and N; or

C, O, and N.

15. The method according to claim 1, wherein at least one of the first precursor and the second precursor comprises a metal precursor; and wherein the metal precursor comprises a metal.

16. The method according to claim 15, wherein the metal is selected from an alkali metal, an earth alkali metal, a transition metal, a lanthanide, and a post transition metal.

17. The method according to claim 15, wherein the metal precursor is selected from a list consisting of: metal halides, metal alkyls, metal alkenyls, metal aryls, metal beta-diketonates, metal alkoxides, and metal aryloxides.

18. The method of claim 1, wherein, based on forming the precursor mixture, the precursor mixture comprises a composition of elements that is greater than a total number of elements corresponding to the first precursor or the second precursor.

19. A method of mixing a first precursor and a second precursor, the method comprising:

providing a precursor module comprising a first precursor vessel comprising a first precursor, a second precursor vessel comprising a second precursor, and a mixing chamber comprising a mixing valve on an exhaust port of the mixing chamber;

providing a first fluid connection between the first precursor vessel and the mixing chamber, the first fluid connection being provided with a first liquid flow regulator;

providing a second fluid connection between the second precursor vessel and the mixing chamber, the second fluid connection being provided with a second liquid flow regulator;

providing a third fluid connection between the mixing chamber and a reaction chamber that is separate from the mixing chamber;

controlling, by a controller, the first liquid flow regulator to provide a first pre-determined quantity of the first precursor to the mixing chamber;

after providing the first pre-determined quantity of the first precursor to the mixing chamber, controlling, by the controller, the second liquid flow regulator to provide a second pre-determined quantity of the second precursor to the mixing chamber;

forming a precursor mixture, in the mixing chamber, by mixing the first pre-determined quantity of the first precursor and the second pre-determined quantity of the second precursor; and opening the mixing valve on the exhaust port of the mixing chamber; and providing, based on the opening, the precursor mixture to the reaction chamber.

* * * * *